United States Patent
Ganci et al.

(10) Patent No.: US 10,581,472 B2
(45) Date of Patent: *Mar. 3, 2020

(54) RECEIVER WITH REDUCED MIXER-FILTER INTERACTION DISTORTION

(71) Applicant: Futurewei Technologies, Inc., Plano, TX (US)

(72) Inventors: Paul R. Ganci, Golden, CO (US); Matthew R. Miller, Arlington Heights, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/016,081

(22) Filed: Jun. 22, 2018

(65) Prior Publication Data

US 2019/0393912 A1    Dec. 26, 2019

(51) Int. Cl.
*H04B 1/10* (2006.01)
*H03G 3/30* (2006.01)
(Continued)

(52) U.S. Cl.
CPC .............. *H04B 1/1018* (2013.01); *H03D 7/12* (2013.01); *H03F 3/19* (2013.01); *H03F 3/45071* (2013.01);
(Continued)

(58) Field of Classification Search
CPC ................... H04B 1/1018; H03D 7/12; H03D 2200/0025; H03H 11/28; H03H 11/126;
(Continued)

(56) References Cited

U.S. PATENT DOCUMENTS

| 5,867,778 A | 2/1999 | Khoury et al. |
| 8,761,707 B1 | 6/2014 | Connell et al. |

(Continued)

FOREIGN PATENT DOCUMENTS

| CN | 101416380 A | 4/2009 |
| CN | 105337625 A | 2/2016 |

OTHER PUBLICATIONS

Notice of Allowance dated Sep. 28, 2018, in U.S. Appl. No. 16/015,926 filed Jun. 22, 2018.
(Continued)

*Primary Examiner* — Eugene Yun
(74) *Attorney, Agent, or Firm* — Vierra Magen Marcus LLP

(57) ABSTRACT

The disclosure relates to technology for a receiver having a receive signal path including a mixer, a differential fixed gain or variable gain amplifier, and a differential filter. The mixer is configured to receive an RF signal, receive an oscillator signal, and output a differential down converted signal at one of a baseband or intermediate frequency (IF). The amplifier is downstream of the mixer and configured to receive the differential down converted signal from the mixer, apply a gain thereto, and output an amplified differential signal. The filter is downstream of the amplifier and configured filter the amplified differential signal received from the amplifier, and output a filtered differential signal. By locating the differential filter downstream of the differential amplifier within the receive signal path, distortion caused by the mixer is mitigated compared to if the filter were located upstream of the filter.

21 Claims, 11 Drawing Sheets

(51) Int. Cl.
*H03H 11/12* (2006.01)
*H03F 3/19* (2006.01)
*H03F 3/45* (2006.01)
*H03H 11/28* (2006.01)
*H03D 7/12* (2006.01)

(52) U.S. Cl.
CPC ......... *H03G 3/3052* (2013.01); *H03H 11/126* (2013.01); *H03H 11/28* (2013.01); *H03D 2200/0025* (2013.01); *H03F 2200/129* (2013.01); *H03F 2200/144* (2013.01); *H03F 2200/171* (2013.01); *H03F 2200/222* (2013.01); *H03F 2200/267* (2013.01); *H03F 2200/294* (2013.01); *H03F 2200/387* (2013.01); *H03F 2200/451* (2013.01); *H03F 2203/45116* (2013.01); *H03F 2203/45512* (2013.01); *H03F 2203/45526* (2013.01); *H03F 2203/45528* (2013.01); *H03F 2203/45576* (2013.01)

(58) Field of Classification Search
CPC ................... H03F 3/45071; H03F 3/19; H03F 2203/45116; H03F 2200/129; H03F 2200/267; H03F 2203/45576; H03F 2200/222; H03F 2200/387; H03F 2200/451; H03F 2200/294; H03F 2200/144; H03F 2203/45526; H03F 2200/171; H03F 2203/45528; H03F 2203/45512
USPC ........................................................ 455/63.1
See application file for complete search history.

(56) References Cited

U.S. PATENT DOCUMENTS

| | | | |
|---|---|---|---|
| 8,928,407 | B2 | 1/2015 | Miller et al. |
| 9,263,993 | B2 | 2/2016 | Peng et al. |
| 9,859,857 | B2 | 1/2018 | Jeong |
| 10,211,865 | B1 * | 2/2019 | Miller ............... H04B 1/16 |
| 2005/0069333 | A1 | 3/2005 | Moeller |
| 2006/0145762 | A1 | 7/2006 | Leete |
| 2007/0018727 | A1 | 1/2007 | Lee et al. |
| 2007/0238421 | A1 | 10/2007 | Rafi et al. |
| 2008/0084236 | A1 | 4/2008 | Chung |
| 2010/0289584 | A1 | 11/2010 | Aroca et al. |
| 2012/0021712 | A1 | 1/2012 | Mikhemar et al. |
| 2013/0234798 | A1 | 9/2013 | Sato |
| 2017/0117861 | A1 | 4/2017 | Jaeger et al. |

OTHER PUBLICATIONS

U.S. Appl. No. 16/015,926, filed Jun. 22, 2018.
U.S. Appl. No. 16/248,435, filed Jan. 15, 2019 by Miller et al.
Non-final Office Action dated Feb. 25, 2019, U.S. Appl. No. 16/248,435, filed Jan. 15, 2019.
Non-final Office Action dated Jul. 8, 2019, U.S. Appl. No. 16/248,435, filed Jan. 15, 2019.
International Search Report & The Written Opinion of the International Searching Authority dated Sep. 26, 2019.
Response to Office Action dated Oct. 4, 2019, U.S. Appl. No. 16/248,435, filed Jan. 15, 2019.
Notice of Allowance dated Oct. 17, 2019, U.S. Appl. No. 16/248,435, filed Jan. 15, 2019.
International Search Report & The Written Opinion of the International Searching Authority dated Sep. 11, 2019 International Application No. PCT/CN2019/091173.

* cited by examiner

RECEIVER WITH REDUCED MIXER-FILTER INTERACTION DISTORTION

CROSS-REFERENCE

This application is related to commonly invented and commonly assigned U.S. patent application Ser. No. 16/015,926, filed Jun. 22, 2018, now U.S. Pat. No. 10,211,865, which is incorporated herein by reference. This application is also related to commonly invented and commonly assigned U.S. patent application Ser. No. 16/248,435, filed Jan. 15, 2019.

FIELD

The disclosure generally relates to radio frequency (RF) signal receivers which can be included, for example, in user equipment (UE) or base stations (BSs) of wireless networks.

BACKGROUND

Receivers included in user equipment (UE) or base stations (BSs) of wireless networks often have a receive signal path that includes a low noise amplifier (LNA), followed by a mixer (e.g., used for frequency down-conversion), followed by a trans-impedance amplifier (TIA), followed by an analog filter, followed by a variable gain amplifier (VGA), followed by an analog-to-digital (A/D) converter, followed by a digital filter. The TIA is used as a current buffer to isolate the filter that is downstream of the TIA from the mixer that is upstream of the TIA. However, such a TIA increases noise and degrades linearity of the receive signal path, as well as increases the total power dissipation of the receive signal path.

BRIEF SUMMARY

According to one aspect of the present disclosure, a receiver comprises a mixer, a differential fixed gain amplifier (FGA) or variable gain amplifier (VGA), and a differential filter that are each part of a receive signal path of the receiver and are coupled in that sequential order. The mixer is configured to receive an RF signal, receive a local oscillator signal, and output a differential down converted signal at one of a baseband or intermediate frequency (IF). The differential FGA or VGA is downstream of the mixer and configured to receive the differential down converted signal from the mixer, apply a gain thereto, and output an amplified differential signal. The differential filter is downstream of the differential FGA or VGA and configured to receive the amplified differential signal from the differential FGA or VGA, filter the amplified differential signal, and output a filtered differential signal. By locating the differential filter downstream of the differential FGA or VGA within the receive signal path, distortion in the receive signal path is mitigated compared to if the differential filter were located upstream of the differential FGA or VGA. Further, in accordance with certain embodiments the receive signal path is devoid of a trans-impedance amplifier (TIA) downstream of the mixer, and thus, the receive signal path is devoid of noise degradation, linearity degradation, and power dissipation that would otherwise be caused by a TIA if the receive signal path included a TIA downstream of the mixer.

Optionally, in any of the preceding aspects, the differential FGA or VGA is configured to provide a first-order frequency response; the differential filter, which is downstream of the differential VGA, is configured to provide a second-order frequency response; and the differential FGA or VGA and the differential filter collectively provide a third-order low pass filter frequency response.

Optionally, in any of the preceding aspects, the differential FGA or VGA is a differential VGA configured to provide a first adjustable gain; the differential filter is configured to provide a second adjustable gain; and the first adjustable gain provided by the differential VGA, and the second adjustable gain provided by the differential filter, are independently adjustable and thereby enable linearity of the third-order low pass filter frequency response to be optimized and noise mitigation within the receive signal path to be optimized through separate adjustments to the first adjustable gain and the second adjustable gain.

Optionally, in any of the preceding aspects, the differential FGA or VGA is a differential VGA configured to provide a first adjustable gain; and the differential VGA is configured such that the first-order frequency response thereof is maintained substantially consistent, and an input impedance thereof is maintained substantially constant, over a range of different gain settings for the first adjustable gain of the differential VGA.

Optionally, in any of the preceding aspects, the differential VGA is a fully differential VGA that includes: differential input terminals of the fully differential VGA including a negative (−) input terminal and a positive (+) input terminal; differential output terminals of the fully differential VGA including a positive (+) output terminal and a negative (−) output terminal; fully differential amplifier circuitry including differential inputs and differential outputs, the differential inputs including a negative (−) input and a positive (+) input, the differential outputs including a positive (+) output and a negative (−) output; a first cross-coupled segment coupled between the differential input terminals of the fully differential VGA and the negative (−) input of the fully differential amplifier circuitry; and a second cross-coupled segment coupled between the differential input terminals of the fully differential VGA and the positive (+) input of the fully differential amplifier circuitry. In accordance with certain embodiments, the first adjustable gain of the fully differential VGA is adjustable by adjusting one or more component values of the first and second cross-coupled segments, while maintaining substantially consistent the first-order frequency response of the fully differential VGA and maintaining substantially constant the input impedance of the fully differential VGA, so long as a specified relationship between the component values of the first and second cross-coupled segments is kept substantially constant.

Optionally, in any of the preceding aspects, the differential filter, which is downstream of the differential VGA, is configured such that the second-order frequency response thereof is maintained substantially consistent, and an input impedance thereof is maintained substantially constant, over a range of different settings for the second adjustable gain of the differential filter.

Optionally, in any of the preceding aspects, the differential filter is a fully differential filter that includes: differential input terminals of the fully differential filter including a negative (−) input terminal and a positive (+) input terminal of the fully differential filter; differential output terminals of the fully differential filter including a positive (+) output terminal and a negative (−) output terminal of the fully differential filter; fully differential filter circuitry including differential inputs and differential outputs, the differential inputs including a negative (−) input and a positive (+) input, the differential outputs including a positive (+) output and a negative (−) output; a first cross-coupled segment coupled between the differential input terminals of the fully differential filter and the negative (−) input of the fully differential amplifier circuitry therein; and a second cross-coupled segment coupled between the differential input terminals of the fully differential filter and the positive (+) input of the fully differential amplifier circuitry therein. In accordance with certain embodiments, the second adjustable gain of the fully differential filter is adjustable by adjusting one or more component values of the first and second cross-coupled segments, while maintaining substantially consistent the second-order frequency response of the fully differential filter and maintaining substantially constant the input impedance of the fully differential filter, so long as a specified relationship between the component values of the first and second cross-coupled segments is kept substantially constant.

Optionally, in any of the preceding aspects, the differential filter, which is downstream of the differential VGA, comprises a fully differential multi-feedback (MFB) low pass filter (LPF) that includes a single fully different operation-amplifier, a pair of feedback resistors, and a pair of feedback capacitors.

According to one other aspect of the present disclosure, a method for use within a receiver comprises: using a mixer to mix an RF signal with an oscillator signal to thereby produce a differential down converted signal at one of a baseband or intermediate frequency (IF); using a differential fixed gain amplifier (FGA) or variable gain amplifier (VGA) downstream of the mixer to apply a gain to the differential down converted signal to thereby produce an amplified differential signal; and using a differential filter downstream of the differential FGA or VGA to filter the amplified differential signal to thereby produce a filtered differential signal; wherein the mixer, the differential VGA, and the differential filter are each part of a receive signal path of the receiver and are coupled in that order.

Optionally, in any of the preceding aspects, by using the differential filter downstream of the differential FGA or VGA within the receive signal path, distortion in the receive signal path that is caused by the mixer is mitigated compared to if the differential filter were used upstream of the differential FGA or VGA.

Optionally, in any of the preceding aspects, no current buffering is performed by any trans-impedance amplifier (TIA) downstream of the mixer, and thus, the receive signal path is devoid of noise degradation, linearity degradation, and power dissipation that would have otherwise be caused by a TIA, if a TIA was used to perform current buffering downstream of the mixer within the receive signal path.

Optionally, in any of the preceding aspects, the differential FGA or VGA is a differential VGA configured to provide a first-order frequency response and a first adjustable gain; the differential filter, which is downstream of the differential VGA, is configured to provide a second-order frequency response and a second adjustable gain; and the differential VGA and the differential filter collectively provide a third-order low pass filter frequency response.

Optionally, in any of the preceding aspects, the differential FGA or VGA is a differential VGA having a first adjustable gain, and the differential filter has an adjustable gain, and a method also includes independently adjusting the first adjustable gain provided by the differential VGA, and the second adjustable gain provided by the differential filter, to optimize linearity of the third-order low pass filter frequency response and optimize noise mitigation within the receive signal path.

Optionally, in any of the preceding aspects, the differential FGA or VGA is a differential VGA having a first adjustable gain, and a method also includes maintaining substantially consistent the first-order frequency response of the differential VGA, and maintaining substantially constant an input impedance of the differential VGA, over a range of different gain settings for the first adjustable gain of the differential VGA.

Optionally, in any of the preceding aspects, a method also includes maintaining substantially consistent the second-order frequency response of the differential filter, and maintaining substantially constant an input impedance of the differential filter, over a range of different gain settings for the second adjustable gain of the differential filter.

According to one other aspect of the present disclosure, a receiver comprises a low noise amplifier (LNA) configured to receive an RF signal from an antenna or coupler. The receiver also includes a mixer configured to receive the RF signal from the LNA, receive an oscillator signal, and output a differential down converted signal at one of a baseband or intermediate frequency (IF). The receiver additionally includes a differential fixed gain amplifier (FGA) or variable gain amplifier (VGA) downstream of the mixer and configured to receive the differential down converted signal from the mixer, apply a gain thereto, and output an amplified differential signal. Additionally, the receiver includes a differential filter downstream of the differential FGA or VGA and configured to receive the amplified differential signal from the differential FGA or VGA, filter the amplified differential signal, and output a filtered differential signal. The receiver also includes an analog-to-digital converter (A/D) downstream of the differential filter and configured to convert the filtered differential RF signal to a digital signal. In such an embodiment, the LNA, the mixer, the differential FGA or VGA, the differential filter, and the A/D are each part of a receive signal path of the receiver. By locating the differential filter downstream of the differential FGA or VGA within the receive signal path, distortion in the receive signal path is mitigated compared to if the differential filter were located upstream of the differential FGA or VGA.

Optionally, in any of the preceding aspects, the differential FGA or VGA is a differential VGA configured to provide a first-order frequency response and a first adjustable gain; the differential filter, which is downstream of the differential VGA, is configured to provide a second-order frequency response and a second adjustable gain; the differential VGA and the differential filter collectively provide a third-order low pass filter frequency response; and the first adjustable gain provided by the differential VGA, and the second adjustable gain provided by the differential filter, are independently adjustable and thereby enable linearity of the third-order low pass filter frequency response to be optimized and noise mitigation within the receive signal path to be optimized through separate adjustments to the first adjustable gain and the second adjustable gain.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

The present disclosure will now be described with reference to the figures (FIGS.), which in general relate to a receiver having a receive signal path including a mixer, a fully differential FGA or VGA, and a fully differential filter. The mixer is configured to receive an RF signal, receive an oscillator signal, and output a differential frequency adjusted version of the signal, e.g., a differential down converted signal. The FGA or VGA is downstream of the mixer and configured to receive the differential frequency adjusted version of the signal from the mixer, apply a gain thereto, and output an amplified differential signal. The filter is downstream of the FGA or VGA and configured to receive the amplified differential RF signal from the FGA or VGA, filter the amplified differential signal, and output a filtered differential signal. By locating the fully differential filter downstream of the fully differential FGA or VGA within the receive signal path, distortion is mitigated compared to if the filter were located upstream of the FGA or VGA.

It is understood that the present embodiments of the disclosure may be implemented in many different forms and that claims' scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
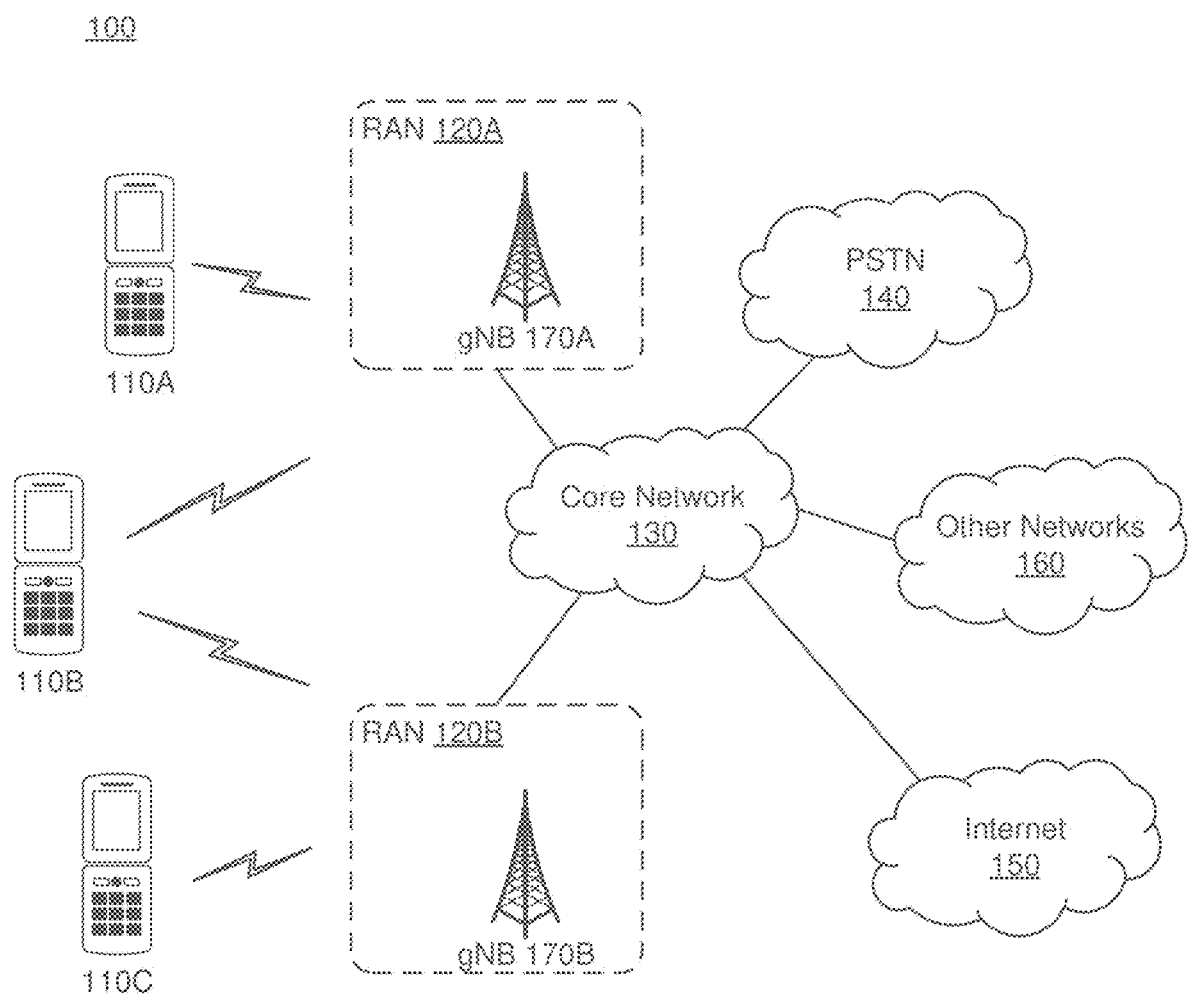
FIG. 1 illustrates an exemplary wireless network for communicating data.
Figure 2:
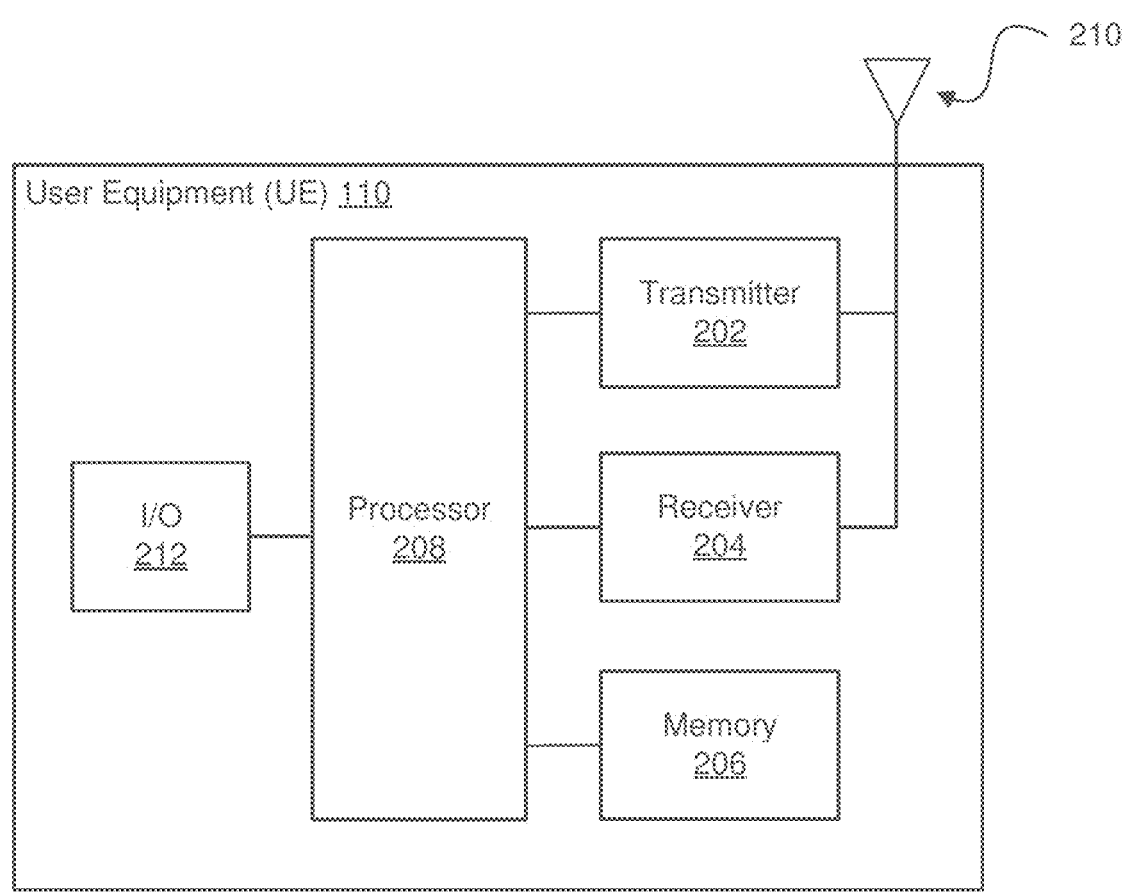
FIG. 2 illustrates exemplary details of an instance of user equipment (UE) introduced in FIG. 1.
Figure 3:
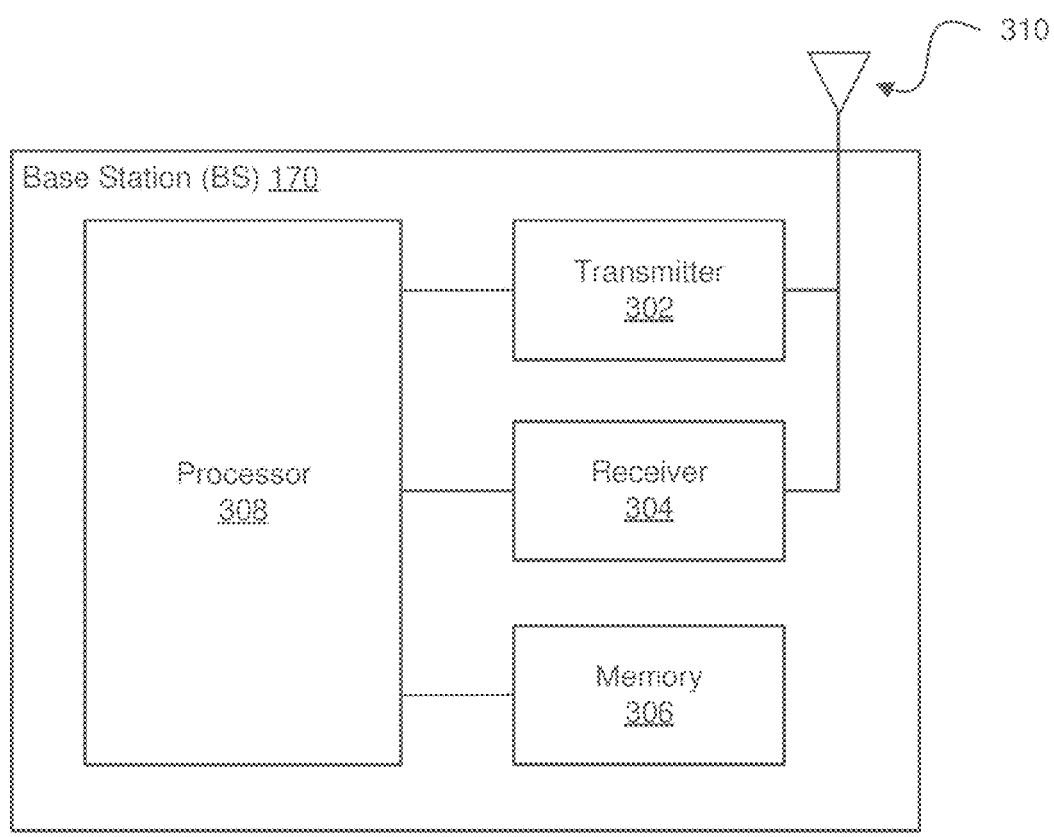
FIG. 3 illustrates exemplary details of an instance of a base station (BS) introduced in FIG. 1.
Figure 4:
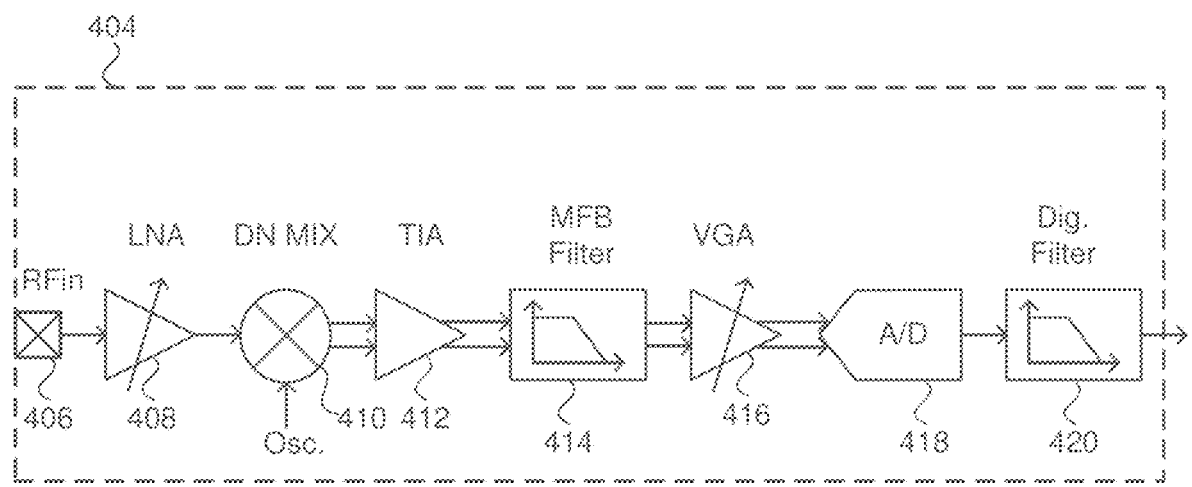
FIG. 4 illustrates exemplary details of a receiver that can be included in UE or a BS.

Before provided additional details of a receiver of an embodiment of the present technology having a receive signal path including a mixer, a fully differential VGA, and a fully differential filter, in that order, FIG. 1 is used to describe an exemplary wireless network for communicating data, FIG. 2 is used to describe exemplary details of an instance of user equipment (UE) introduced in FIG. 1, and FIG. 3 is used to describe exemplary details of an instance of a base station (BS) introduced in FIG. 1. Additionally, FIG. 4 is used to describe exemplary details of a receiver that can be the receiver included in UE or a BS.

Referring to FIG. 1, illustrated therein is an exemplary wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g. 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A, 110B, and 110C, which can be referred to individually as an UE 110, or collectively as the UEs 110, are configured to operate and/or communicate in the system 100. For example, an UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

FIG. 2 illustrates example details of an UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure (FIG.), the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 204 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

Certain embodiments of the present technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

FIG. 4 illustrates exemplary details of a receiver 404, which can be the receiver 204 included in the UE 110 (shown in FIG. 2) or the receiver 304 included in the BS 170 (shown in FIG. 3), but is not limited thereto. Referring to FIG. 4, the receiver 404 is shown as including an input 406 at which is received a radio frequency (RF) signal, and thus, the input 406 can also be referred to as the RF input 406. The RF input 406 can be coupled to an antenna (e.g., 210 or 310) or a coupler, but is not limited thereto. The RF signal received by the RF input 406 is provided to a low noise amplifier (LNA) 408, which may have an adjustable gain. The LNA 408 amplifies the relatively low-power RF signal it receives without significantly degrading the signal's signal-to-noise ratio (SNR). The amplified RF signal that is output by the LNA 408 is provided to a mixer 410. The mixer 410, in addition to receiving the amplified RF signal from the LNA 408, also receives an oscillator signal (e.g., from a local oscillator, not shown), and adjusts the frequency of the amplified RF signal, e.g., from a first frequency to a second frequency that is lower than the first frequency. More specifically, the mixer 410 can be a down-mixer (DN MIX) that frequency down-converts the amplified signal from a relatively high frequency to a baseband frequency, or an intermediate frequency (IF) that is offset from the baseband frequency.

Still referring to FIG. 4, the frequency down-converted signal that is output from the mixer 410 is shown as being provided to a trans-impedance amplifier (TIA) 412. The TIA 412 acts as a current buffer to isolate a multi-feedback (MFB) filter 414 that is downstream of the TIA 412, from the mixer 410 that is upstream of the TIA 412. The MFB filter 414 low pass filters the frequency down-converted signal, to filter out high frequency signal components that are not of interest, such as HF noise. The filtered signal that is output from the MFB filter 414 is provided to a variable gain amplifier (VGA) 416, which is used to amplify the signal before it is provided to an analog-to-digital converter (A/D) 418, which converts the signal from an analog signal to a digital signal. The digital signal output from the A/D 418 is then provided to a digital filter 420, which performs additional filtering to remove out of band signal components and attenuates quantization energy from the A/D 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

In FIG. 4, the TIA 412, the MFB filter 414, and the VGA 416 are illustrated as fully differential circuits, since they each have respective differential inputs and differential outputs. By contrast the LNA 408 as illustrates as having a single ended input and a single ended output, the mixer 410 is illustrated as having a single ended input and differential outputs, and the A/D 418 is illustrating as having differential inputs and a single ended output. However, it is noted that the LNA 408 can alternatively have a single ended input and differential outputs, or differential inputs and differential outputs. Similarly, the mixer 410 can alternatively be a fully differential mixer have differential inputs and differential outputs, and the A/D 418 can be fully differential A/D having differential inputs and differential outputs. Other variations are also possible and within the scope of the embodiments described herein.

Figure 5:
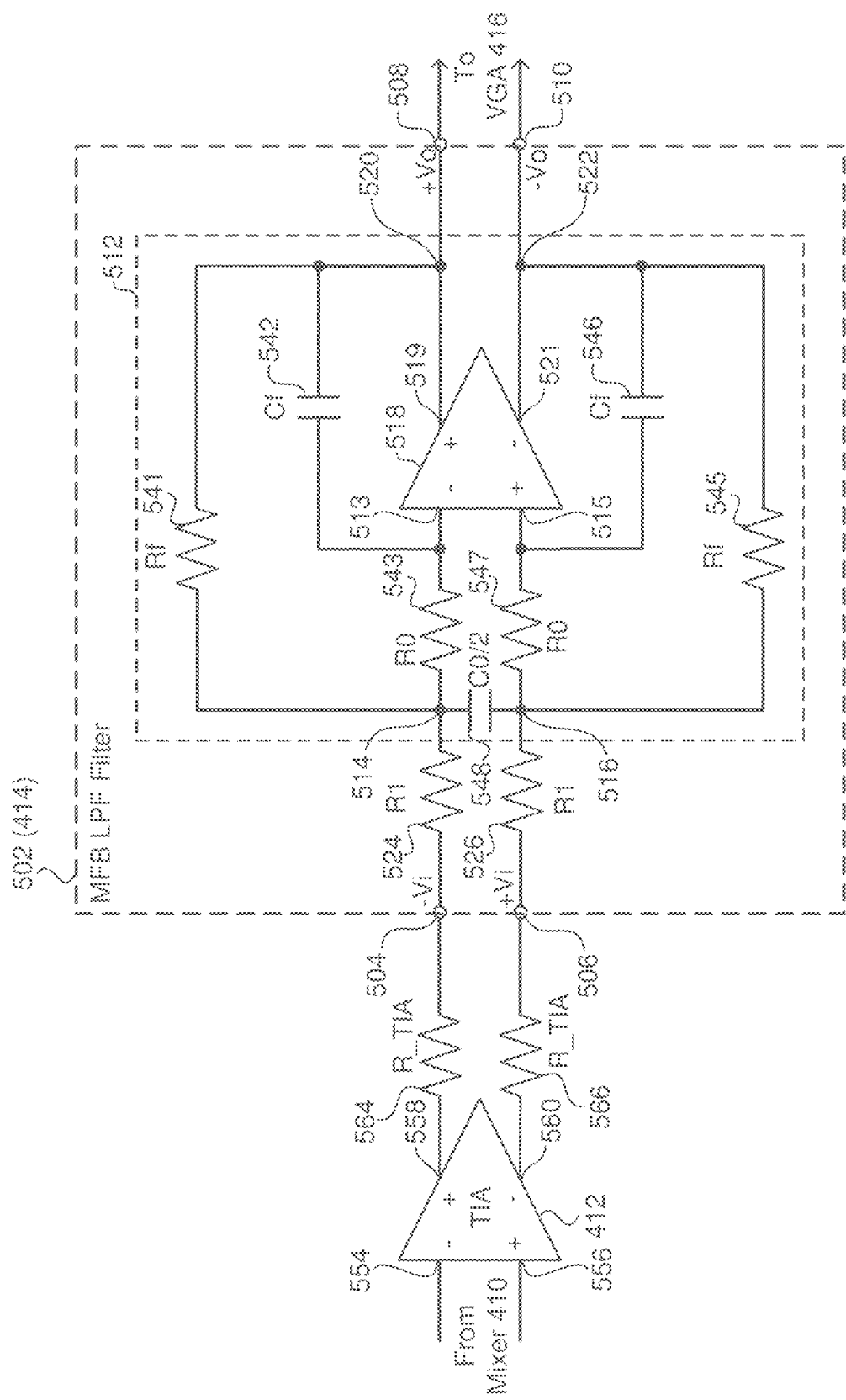
FIG. 5 illustrates a prior art fully differential multi-feedback (MFB) low pass filter (LPF) that can be included in a receiver, such as the receiver illustrated in FIG. 4.

FIG. 5 illustrates an exemplary details of a prior art fully differential multi-feedback (MFB) low pass filter (LPF) that can be included in a receiver (such as the receiver illustrated in FIG. 4) downstream of a TIA (e.g., the TIA 412 initially shown in FIG. 4) within a receive signal path. More specifically, the MFB LPF 502 can be used as the MFB filter 414 shown in FIG. 4. FIG. 5 is also used to explain how including such an MFB LPF downstream of a TIA (e.g., the TIA 412 initially shown in FIG. 4) can increase noise of a receive signal path, degrade linearity of the receive signal path, and increase total power dissipation caused by the receive signal path. The MFB LPF 502 is a fully differential filter because it includes both differential inputs and differential outputs. Referring briefly back to FIG. 4, a receive signal path can be considered to include the analog signal path that extends between the RF input 406 and the A/D 418.

Referring again to FIG. 5, the fully differential MFB LPF 502, which can also be referred to herein more succinctly as the MFB filter 502, is shown as having differential input terminals, including a negative (−) input terminal 504 and a positive (+) input terminal 506. The MFB filter 502 is also shown as having differential output terminals, including a positive (+) output terminal 508 and a negative (−) output terminal 510. The MFB filter 502 includes a fully differential operational amplifier (op-amp) 518 including differential inputs and differential outputs, wherein the differential inputs include a negative (−) input 513 and a positive (+) input 515, and the differential outputs include a positive (+) output 519 and a negative (−) output 521. Negative inputs are also known as inverting inputs, and positive inputs are also known as non-inverting inputs. Similarly, negative outputs are also known as inverting outputs, and positive outputs are also known as non-inverting outputs. The MFB filter 502 is a fully differential filter because it includes both differential inputs and differential outputs.

In the MFB filter 502, the positive (+) output 519 of the op-amp 518 is connected to the negative (−) input 513 of the op-amp 518 by a feedback capacitor component 542 having a capacitance value Cf. The negative (−) output 521 of the op-amp 518 is connected to the positive (+) input 515 of the op-amp 518 by a feedback capacitor component 546 having the same capacitance value Cf as the feedback capacitor component 542. The MFB filter 502 also includes feedback resistor components 541 and 545 that each have the same resistance value Rf. One of the terminals of the feedback resistor component 541 is connected to the positive (+) output 519 of the op-amp 518, and the other terminal of the feedback resistor 541 is connected to one of the terminals of the capacitor component 548, which has a capacitance value C0/2. One of the terminals of the feedback resistor component 545 is connected to the negative (−) output 521 of the op-amp 518, and the other terminal of the feedback resistor component 545 is connected to the other one of the terminals of the capacitor component 548. One of the terminals of a resistor component 543, having a resistance value R0, is connected to the negative (−) input 513 of the op-amp 518, and the other one of the terminals of the resistor component 543 is connected to one of the terminals of the capacitor component 548. One of the terminals of a resistor component 547, having the resistance value R0, is connected to the positive (+) input 515 of the op-amp 518, and the other one of the terminals of the resistor component 547 is connected to the other one of the terminals of the capacitor component 548. A resistor component 524, having a resistance value R1, is coupled between the negative input terminal 504 of the MFB filter 502 and one of the terminals of the capacitor component 548. A resistor component 526, having the same resistance value R1 as the resistor component 524, is coupled between the positive input terminal 506 of the MFB filter 502 and the other one of the terminals of the capacitor component 548.

Vo(s)/Vi(s) for the fully differential MFB LPF 502 is shown in the following Equation(1A):

$$\frac{Vo(s)}{Vi(s)} = \text{Gain} * \frac{\frac{-1}{C0 * Cf * R0 * Rf}}{s^2 + s * \frac{1}{C0} * \left(\frac{1}{R0} + \frac{1}{R1} + \frac{1}{Rf}\right) + \frac{1}{C0 * Cf * R0 * Rf}}$$

where,
Vi(s) is the voltage of the differential input signal,
Vo(s) is the voltage of the differential output signal,
Gain is equal to Rf/R1,
R0 is the resistance of each of the resistor components 543 and 547,
R1 is the resistance of each of the resistor components 524 and 526,
Rf is the resistance of each of the feedback resistor components 541 and 545,
Cf is the capacitance of each of the feedback capacitor components 542 and 546,
C0 is twice the capacitance of the capacitor component 548, and
s is a variable that represents complex frequency.

Still referring to FIG. 5, the circuitry within the dashed lined block labeled 512 can be referred to collectively as fully differential filter circuitry 512 having differential inputs and differential outputs, wherein the differential inputs include a negative (−) input 514 and a positive (+) input 516, and the differential outputs include a positive (+) output 520 and a negative (−) output 522. The fully differential filter circuitry 512 can be referred to more generally as fully differential signal processing circuitry. As can be appreciated from FIG. 5, the resistor components 524 and 526, which have the same resistance value R1, are connected between the differential input terminals 504, 506 of the MFB filter 502 and the differential inputs 514, 516 of the fully differential filter circuitry 512.

Still referring to FIG. 5, the portion of the receive signal path illustrated therein also includes the TIA 412 (introduced in FIG. 4) upstream of the MFB filter 502. The TIA 412 is shown as being a fully differential TIA having differential input terminals, including a negative (−) input terminal 554 and a positive (+) input terminal 556. The fully differential TIA 412 is also shown as having differential output terminals, including a positive (+) output terminal 558 and a negative (−) output terminal 560. As noted above, the TIA 412 acts as a current buffer to isolate the MFB filter 502 (414 in FIG. 4) that is downstream of the TIA 412, from the mixer 410 (shown in FIG. 4) that is upstream of the TIA 412. In FIG. 5, an output impedance of the fully differential TIA 412 is illustrated by the resistors 564 and 566, each having an impedance value R_TIA. In other words, the resistors 564 and 566 are not discrete resistors, but rather, represent an output impedance of the TIA 412. The portion of the TIA impedance represented by the resistor 564 is in series with the resistor 524 of the MFB filter 502 having the resistance value R1, and the portion of the TIA impedance represented by the resistor 566 is in series with the resistor 526 of the MFB filter 502 also having the resistance value R1. Since resistors in series are additive, where the configuration shown in FIG. 5 is used, the value of R1 in Equation(1A) above would actually be the sum of R1+R_TIA. This adversely affects the transfer function of the MFB filter 502 by causing DC gain error and also causing distortion of the frequency response associated with the MFB filter 502. The TIA 412 within the receive signal path also has additional adverse effects on the receive signal path. For example, the TIA 412 increases the noise in the overall receive signal path. Additionally, the TIA 412 degrades the linearity of the overall receive signal path. The TIA 412 also increases the total power dissipation of the overall receive signal path. Further, where the configuration shown in FIG. 5 is used, the gain of the MFB filter 502 would actually be equal to Rf/(R1+R_TIA), not equal to simply Rf/R1, since series resistors R_TIA and R1 are additive.

Figure 6:
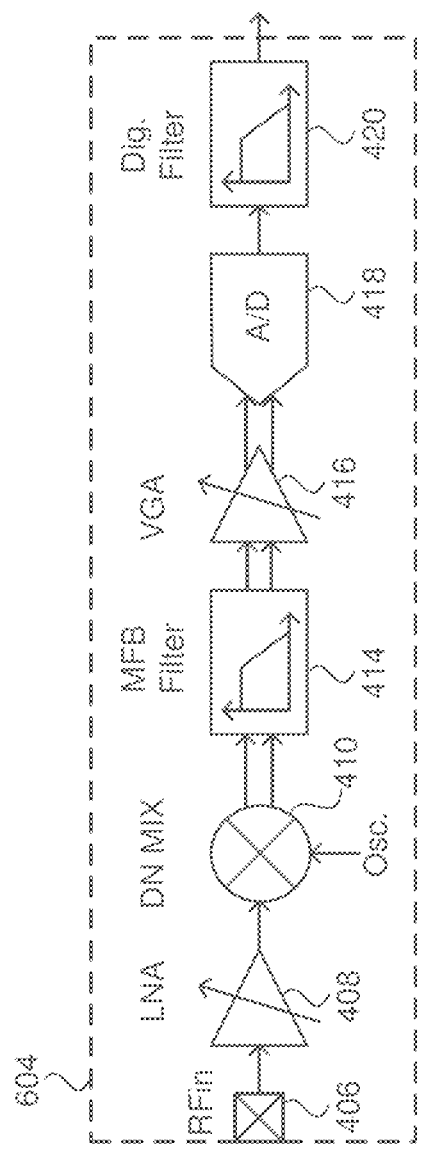
FIG. 6 illustrates exemplary details of an alternative receiver that can be included in UE or a BS.

In order to reduce and preferably eliminate the adverse effects that the TIA 412 has on the receive signal path, the TIA 412 can be removed from the receive signal path, as illustrated for example in the exemplary receiver 604 shown in FIG. 6. More specifically, FIG. 6 illustrates exemplary details of a receiver 604, which can be the receiver 204 included in the UE 110 (shown in FIG. 2) or the receiver 304 included in the BS 170 (shown in FIG. 3), but is not limited thereto. Elements or blocks in FIG. 6 that are the same as those in FIG. 4 are labeled the same in FIG. 6 as they were in FIG. 4 and need not be described again. A comparison between FIG. 6 and FIG. 4 shows that the only difference between the receiver 604 in FIG. 6 and the receiver 404 in FIG. 4 is that the TIA 412 (that was between the mixer 410 and the MFB filter 414 in FIG. 4) is not included in the receiver 604. Accordingly, the receiver 604 can be referred to as a TIA bypassed receiver 604.

Figure 7:
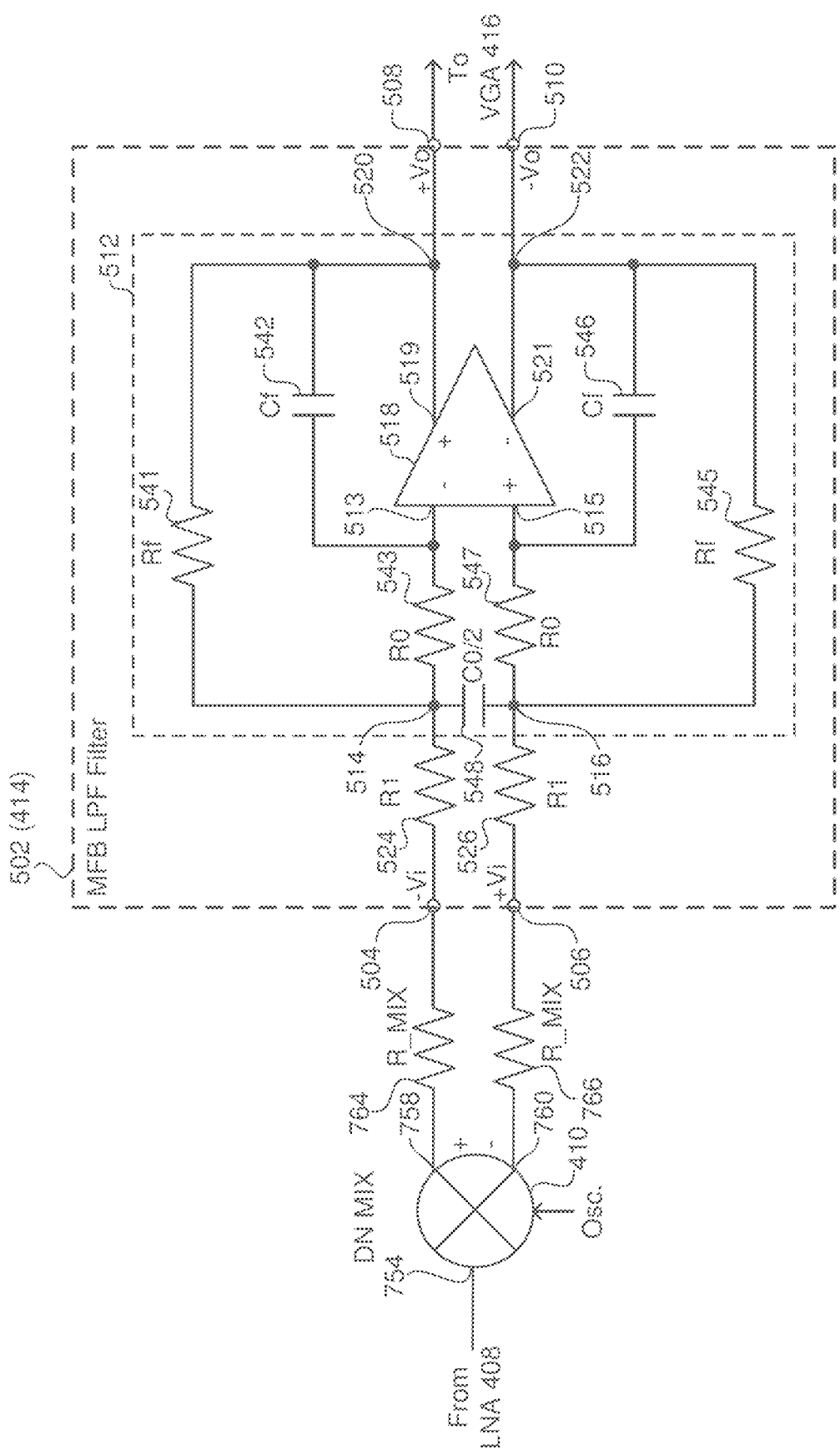
FIG. 7 illustrates a prior art fully differential multi-feedback (MFB) low pass filter (LPF) that can be included in a receiver, such as the receiver illustrated in FIG. 6.

FIG. 7 illustrates exemplary details of the portion of the receive signal path shown in FIG. 6 that includes the mixer 410 and the MFB filter 414, with the MFB filter 414 implemented using the specific implementation of the MFB filter 502 discussed above with reference to FIG. 5. Elements or blocks in FIG. 7 that are the same as those in FIG. 5 are labeled the same in FIG. 7 as they were in FIG. 5 and need not be described again.

Referring to FIG. 7, the portion of the receive signal path illustrated therein also includes the mixer 410 (introduced in FIG. 4) upstream of the MFB filter 502. The mixer 410 is shown as being a differential mixer having an input terminal 754 and differential output terminals, including a positive (+) output terminal 758 and a negative (−) output terminal 760. Instead of having a single input terminal 754, the mixer 410 can instead be a fully differential mixer that includes differential input terminals, including a negative (−) input terminal and a positive (+) input terminal. In FIG. 7, an output impedance of the mixer 410 is illustrated by the resistors 764 and 766, each having an impedance value R_MIX. The portion of the mixer impedance represented by the resistor 764 is in series with the resistor 524 of the MFB filter 502 having the resistance value R1, and the portion of the mixer impedance represented by the resistor 766 is in series with the resistor 526 of the MFB filter 502 having the resistance value R1. Since resistors in series are additive, where the configuration shown in FIG. 7 is used, the value of R1 in Equation(1A) above would actually be the sum of R1+R_MIX. This adversely affects the transfer function of the MFB filter 502 by causing DC gain error and also causes distortion of the frequency response associated with the MFB filter 502. Another disadvantage of the portions of the exemplary receive signal paths shown in FIGS. 5 and 7 is that the MFB filter 502 has a fixed gain, which limits how finely the gain setting of the receive signal path can be set.

Figure 8:
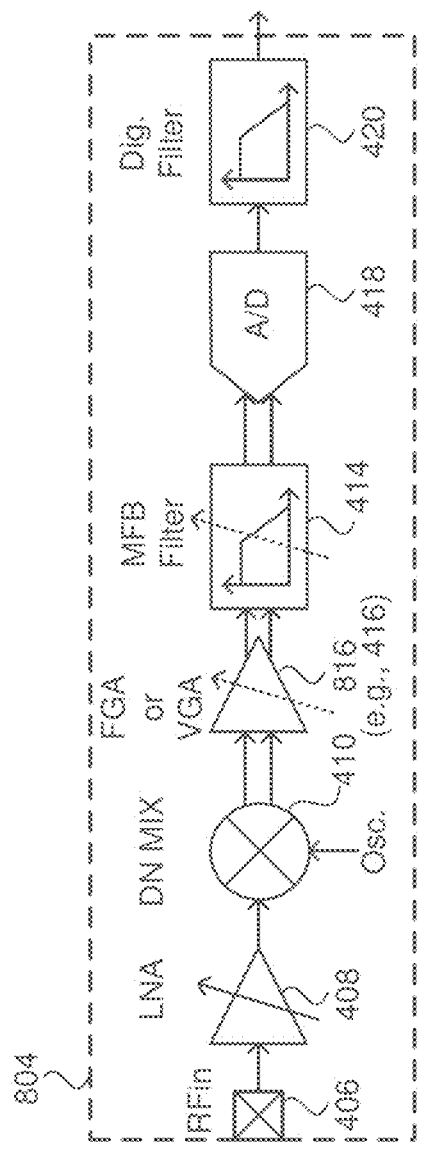
FIG. 8 illustrates a receiver according to an embodiment of the present technology, which receiver that can be included in UE or a BS, but is not limited thereto.

In accordance with certain embodiments of the present technology, in order to reduce and preferably eliminate certain adverse effects resulting from the mixer 410 being immediately upstream of the MFB filter 414 within a receive signal path of a receiver, the order of the VGA 416 and the MFB filter 414 are reversed, as shown in FIG. 8. More specifically, FIG. 8 illustrates exemplary details of a receiver 804, which can be the receiver 204 included in the UE 110 (shown in FIG. 2) or the receiver 304 included in the BS 170 (shown in FIG. 3), but is not limited thereto. Elements or blocks in FIG. 8 that are the same as those in FIGS. 4 and 6 are labeled the same in FIG. 8 as they were in FIGS. 4 and 6 and need not be described again. In FIG. 8, there is a dashed arrow shown across the FGA or VGA 816, representing that this block may or may not have a variable gain. Similarly, in FIG. 8, there is a dashed arrow shown across the MFB filter 414, representing that this block may or may not have a variable gain. The FGA or VGA 816 is a fully differential amplifier because it includes both differential inputs and differential outputs.

More specifically, FIG. 8 illustrates a receiver 804 according to certain embodiments of the present technology. Referring to FIG. 8, the receiver 804 is shown as including an input 406 at which is received a radio frequency (RF) signal, and thus, the input 406 can also be referred to as the RF input 406. The RF input 406 can be coupled to an antenna or a coupler, but is not limited thereto. The RF signal received by the RF input 406 is provided to the LNA 408, which may have an adjustable gain. The LNA 408 amplifies the relatively low-power RF signal it receives without significantly degrading the signal's signal-to-noise ratio (SNR). The amplified RF signal that is output by the LNA 408 is provided to the mixer 410. The mixer 410, in addition to receiving the amplified RF signal from the LNA 408, also receives an oscillator signal (e.g., from a local oscillator, not shown), and adjusts the frequency of the amplified RF signal, e.g., from a first frequency to a second frequency that is lower than the first frequency. More specifically, the mixer 410 can be a down-mixer (DN MIX) that frequency down-converts the amplified RF signal from a relatively high frequency to a baseband frequency, or an intermediate frequency (IF) that is offset from the baseband frequency.

Still referring to FIG. 8, the frequency down-converted signal that is output from the mixer 410 is shown as being provided to a fixed gain amplifier (FGA) or VGA 816 (e.g., the VGA 416), which is used to amplify the frequency down-converted signal before it is filtered by the MFB filter 414. The MFB filter 414 low pass filters the amplified frequency down-converted signal, output by the FGA or VGA 816, to filter out high frequency signal components that are not of interest, such as HF noise. Depending upon the implementation, the MFB filter 414 can have a fixed gain, or alternatively, can have an adjustable gain (which can also be referred to as a variable gain). The filtered amplified signal that is output from the MFB filter 414 is provided to the A/D 418, which converts the signal from an analog signal to a digital signal. The digital signal output from the A/D 418 is then provided to the digital filter 420, which performs additional filtering to remove out of band signal components and attenuates quantization energy from the A/D 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

Figure 9:
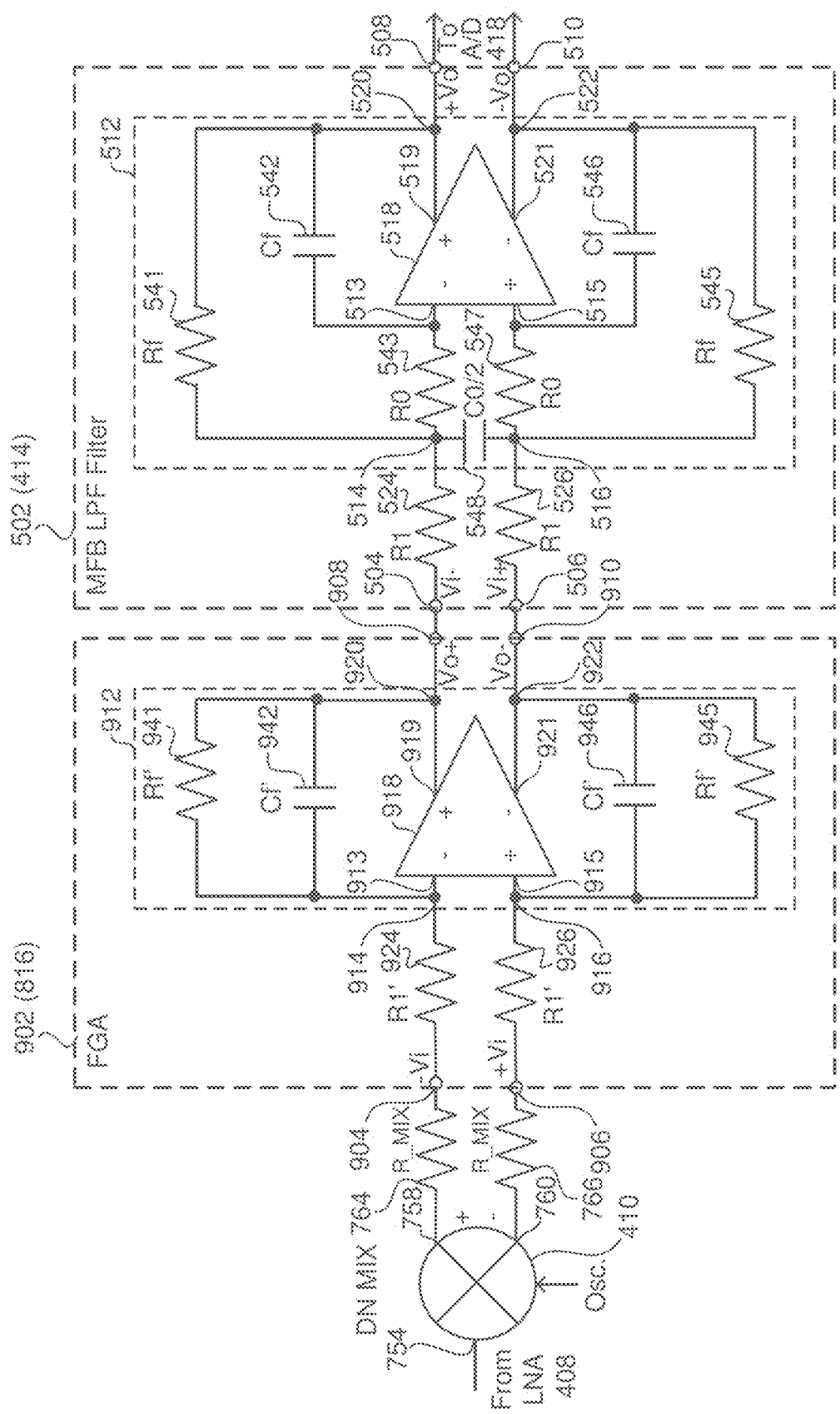
FIG. 9 illustrates additional details of the receiver introduced in FIG. 8, according to an embodiment of the present technology.

FIG. 9 illustrates additional details of the receiver 804 introduced in FIG. 8, according to an embodiment of the present technology, wherein the FGA or VGA 816 (in FIG. 8) is implemented as an FGA 902, and wherein the MFB LPF filter 414 (in FIG. 8) is implemented as the fixed gain MFB LPF filter 502 (initially shown in FIG. 5). More specifically, FIG. 9 illustrates exemplary details of the FGA 816 that is downstream of the mixer 410, and exemplary details of the MFB filter 502 that is downstream of the FGA 902. In FIG. 9 the MFB filter 414 is shown as being implemented using the MFB filter 502 described above initially with reference to FIG. 5, and thus, the details of the MFB filter 502 can be appreciated from the above discussion of FIG. 5 and need not be repeated in the discussion of FIG. 9.

In FIG. 9, the FGA or VGA 816 is shown as being implemented as a fully differential amplifier 902. The fully differential amplifier 902, which can also be referred to herein more succinctly as the amplifier 902, is shown as having differential input terminals, including a negative (−) input terminal 904 and a positive (+) input terminal 906. The VGA 902 is also shown as having differential output terminals, including a positive (+) output terminal 908 and a negative (−) output terminal 910. The VGA 902 includes a fully differential op-amp 918 including differential inputs and differential outputs, wherein the differential inputs include a negative (−) input 913 and a positive (+) input 915, and the differential outputs include a positive (+) output 919 and a negative (−) output 921. The amplifier 902 is a fully differential amplifier because it includes both differential inputs and differential outputs.

In the VGA 902, the positive (+) output 919 of the op-amp 918 is connected to the negative (−) input 913 of the op-amp 918 by a feedback capacitor component 942 having a capacitance value Cf. The negative (−) output 921 of the op-amp 918 is connected to the positive (+) input 915 of the op-amp 918 by a feedback capacitor component 946 having the same capacitance value Cf as the feedback capacitor component 942. The VGA 902 also includes feedback resistor components 941 and 945 that each have the same resistance value Rf. The feedback resistor component 941 is connected in parallel with the feedback capacitor component 942, and thus, the positive (+) output 919 of the op-amp 918 is also connected to the negative (−) input 913 of the op-amp 918 by the feedback resistor component 941 having a resistance value Rf. The feedback resistor component 945 is connected in parallel with the feedback capacitor component 946, and thus, the negative (−) output 921 of the op-amp 918 is also connected to the positive (+) input 915 of the op-amp 918 by the feedback resistor component 945 having the same resistance value Rf as the feedback resistor component 941. Where the amplifier 902 has a fixed gain, the amplifier 902 can also be referred to as the FGA 902.

Still referring to FIG. 9, the circuitry within the dashed lined block labeled 912 can be referred to collectively as fully differential gain circuitry 912 having differential inputs and differential outputs, wherein the differential inputs include a negative (−) input 914 and a positive (+) input 916, and the differential outputs include a positive (+) output 920 and a negative (−) output 922. The fully differential filter circuitry 912 can be referred to more generically as fully differential signal processing circuitry. In FIG. 9, a resistor 924 having a resistance value R1' is coupled between the negative (−) input terminal 904 of the amplifier 902 and the negative (−) input 914 of the fully differential filter circuitry 912, which is the same node as the negative (−) input 913 of the op-amp 918. Similarly, a resistor 926 having a resistance value R1' is coupled between the positive (−) input terminal 906 of the amplifier 902 and the positive (+) input 916 of the fully differential filter circuitry 912, which is the same node as the positive (+) input 915 of the op-amp 918.

Vo(s)/Vi(s) for the fully differential amplifier 902 is shown in the following Equation(2A):

$$\frac{Vo(s)}{Vi(s)} = -\text{Gain} * \frac{1}{1 + (s * Rf * Cf)}$$

where,
Vi(s) is the voltage of the differential input signal,
Vo(s) is the voltage of the differential output signal,
Gain is equal to Rf/R1',
Rf is the resistance of each of the feedback resistor components 941 and 945,
Cf is the capacitance of each of the feedback capacitor components 942 and 946, and
s is a variable that represents complex frequency.

In FIG. 9, an output impedance of the mixer 410 is illustrated by the resistors 764 and 766, each having an impedance value R_MIX, as was also illustrated in FIG. 7. In other words, the resistors 764 and 766 are not discrete resistors, but rather, represent an output impedance of the mixer 410. The portion of the mixer impedance represented by the resistor 764 is in series with the resistor 924 of the amplifier 902 having the resistance value R1', and the portion of the mixer impedance represented by the resistor 766 is in series with the resistor 926 of the amplifier 902 having the resistance value R1'. Since resistors in series are additive, where the configuration shown in FIG. 9 is used, the value of R1' in Equation(2A) above would actually be the sum of R1'+R_MIX, and thus the Gain of the VGA would actually be Rf/(R1'+R_MIX). Beneficially, the R_MIX impedance that is added to R1' only impacts the DC gain of the amplifier 902, and the R_MIX impedance added at the mixer-amplifier interface does not cause increased distortion in the receive signal path because the transfer characteristic indicated in Equation(2A) is independent of the amplifier input impedance R1' due to the virtual ground node connections 914 and 916 at inputs 913 and 916 of the op-amp 918.

Referring again to FIG. 8, in accordance with certain embodiments of the present technology, gain control within the receiver 804 can be provided in one or both of the FGA or VGA 816 and/or the MFB filter 414. In other words, the FGA or VGA 816 and the MFB filter 414 can provide cascaded gain stages. In certain embodiments, the FGA or VGA 816 is implemented as a VGA having a variable gain. Additionally, or alternatively, the MFB filter 414 can either have a fixed gain or a variable gain, depending upon implementation. Beneficially, by placing the FGA or VGA 816 upstream of the MFB filter 414 within the receive signal path, such that the differential output signal of the mixer is provided to differential input terminals of the FGA or VGA 816 (rather than to differential input terminals of the MFB filter 414, as was the case in FIG. 6), an improved gain line-up is provided that also eliminates the increased distortion due to interaction between the mixer 410 and the MFB filter 414.

Figure 10:
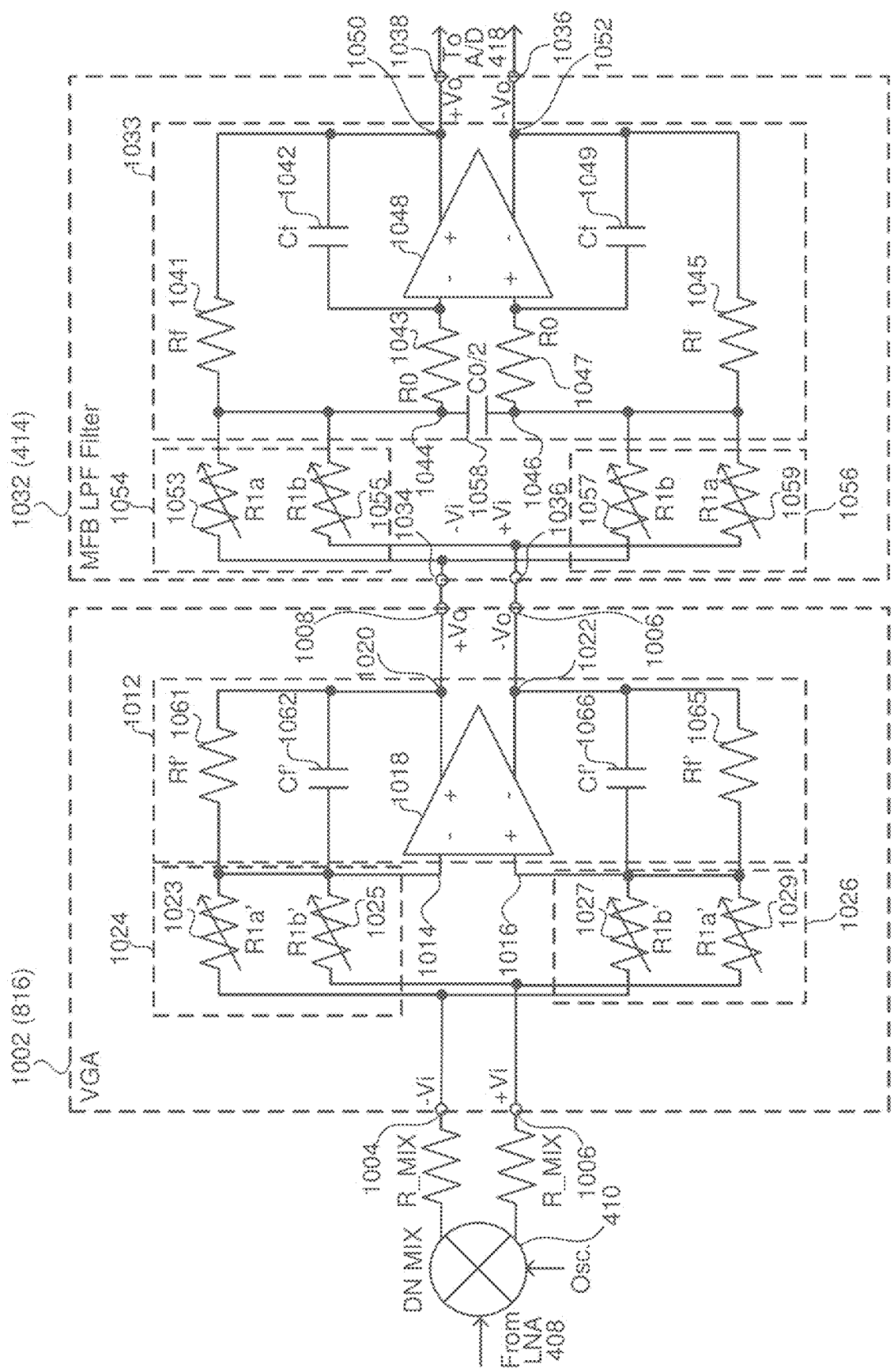
FIGS. 10 and 11 illustrate additional details of the receiver introduced in FIG. 8, according to further embodiments of the present technology.

In accordance with certain embodiments of the present technology, such as those shown in FIGS. 9 and 10, the FGA or VGA 816 followed by the MFB filter 414 collectively provide for a third-order low pass filter response that provides for added selectivity of a desired baseband frequency, or a desired intermediate frequency (IF) that is offset from the baseband frequency. Explained in more detail, the fully differential FGA or VGA 816 (or more specifically, the fully differential FGA 902 or VGA 1002) is configured to provide a first-order frequency response and a first gain, and the fully differential MFB filter 414 (or more specifically, fully differential fixed gain MFB filter 502 or variable gain MFB filter 1032), which is downstream of the fully differential FGA or VGA, is configured to provide a second-order frequency response and a second gain that can either be fixed or adjustable, depending upon implementation.

Referring to FIG. 9, the FGA or VGA 816 is implemented as an amplifier 902 having a fixed gain, and thus block 902 when having a fixed gain can be referred to as an FGA 902. Where the amplifier 902 has a fixed gain, the resistance value Rf' of the feedback resistors 941 and 945 is fixed, and the resistance value R1' of the input resistors 924 and 926 is also fixed. However, if it were desirable to make the amplifier 902 be a variable gain amplifier, it would also be desirable for the amplifier 902 to have substantially the same (i.e., substantially consistent) frequency response and substantially the same (i.e., substantially constant) input impedance across the different gain settings.

One way to make the amplifier 902 in FIG. 9 have a variable gain, is to have at least some of the passive components included in the amplifier 902 have adjustable values. In the embodiment shown in FIG. 9, in order to adjust the gain of the amplifier 902, while maintaining substantially the same (i.e., substantially consistent) frequency response, as well as substantially the same (i.e., substantially constant) input impedance, would require adjusting the feedback resistor components 941 and 945 and the feedback capacitor components 942 and 946. However, the complex circuitry required to control these four passive components would significantly increase the die area and cost required to provide the amplifier 902, particularly if the amplifier 902 had several different bandwidth modes. Additionally, the fact that the relationship between the component values is not linear across the different gain settings adds to the difficulty of maintaining substantially the same frequency response. A preferred technique for providing an amplifier having a variable gain, while maintaining substantially the same (i.e., substantially consistent) frequency response, as well as substantially the same (i.e., substantially constant) input impedance, is described below with reference to FIG. 10.

The MFB filter 502 can have a fixed gain, which may or may not be unity gain, or may have an adjustable gain. Where the MFB filter 502 has a fixed gain, the passive components of the MFB filter 502 shown in FIG. 9 can have fixed values. Where the MFB filter 502 has an adjustable gain, it is desirable for the MFB filter to have a substantially consistent frequency response and a substantially constant input impedance across the different gain settings. However, in order to adjust the gain of the MFB filter 502 while maintaining a substantially consistent frequency response across different gain settings, at least five of the nine passive components included in the MFB filter 502 need to be adjusted, including the feedback resistor components 541 and 545, the feedback capacitor components 542 and 546, and the capacitor component 548. However, even if these five of the nine passive components of the MFB filter 502 are adjusted to maintain substantially a substantially consistent frequency response for different gain settings, the input impedance of the MFB filter 502 significantly changes from one gain setting to another, which is typically undesirable.

In order to adjust the gain of the MFB filter 502, while maintaining substantially the same (i.e., substantially consistent) frequency response, as well as substantially the same (i.e., substantially constant) input impedance, would require adjusting at least six of the nine passive components included in the MFB filter 502, including the feedback resistor components 541 and 545, the feedback capacitor components 542 and 546, and the resistor components 524 and 526. However, the complex circuitry required to control at least six of the nine passive components would significantly increase the die area and cost required to provide the MFB filter 502, particularly if the MFB filter 502 had several different bandwidth modes. Additionally, the fact that the relationship between the component values is not linear across the different gain settings adds to the difficulty of maintaining substantially the same frequency response, as well as substantially the same input impedance, across different gain settings. A preferred technique for providing an MFB filter having a variable gain, while maintaining substantially the same (i.e., substantially consistent) frequency response, as well as substantially the same (i.e., substantially constant) input impedance, is described below with reference to FIG. 10.

A resistor component, as the term is used herein, can include a single circuit element, such as a single resistor, or multiple circuit elements or sub-components, such as multiple resistors connected in a resistor network, but is not limited thereto. For example, a resistor component having a resistance of 1 kilo-ohm, can be implemented using a single 1 kilo-ohm resistor, two 500 ohm resistors connected in series, or two 2 kilo-ohm resistors connected in parallel, but is not limited thereto. A capacitor component, as the term is used herein, can include a single circuit element, such as single capacitor, or multiple circuit elements or sub-components, such as multiple capacitors connected in a capacitor network, but is not limited thereto. Similarly, an inductor component, as the term is used herein, can include a single circuit element, or multiple circuit elements or sub-components, such as one or more inductors. Resistors, capacitors, and inductors are examples of various types of passive components, each of which can also be referred to as an impedance component having an impedance value.

In accordance with certain embodiments of the present technology, described below with reference to FIG. 10, the resistor components 524 and 526 of the fully differential the MFB filter 502 (in FIG. 9) are replaced with two cross-coupled segments 1054 and 1056 (as shown in FIG. 10). Benefits of using the cross-coupled segments 1054 and 1056 will be described below. Additionally, or alternatively, the resistor components 924 and 926 of the fully differential amplifier 902 (in FIG. 9) are replaced with two cross-coupled segments 1024 and 1026 (as shown in FIG. 10). Benefits of using the cross-coupled segments 1024 and 1026 will be described below.

Referring to FIG. 10, the fully differential MFB LPF 1032, which can also be referred to herein more succinctly as the MFB filter 1032, can be used as the MFB filter 414 in the receiver 804 initially described above with reference to FIG. 8. The MFB filter 1032 is shown as having differential input terminals, including a negative (−) input terminal 1034 and a positive (+) input terminal 1036. The MFB filter 1032 is also shown as having differential output terminals, including a positive (+) output terminal 1038 and a negative (−) output terminal 1036. The MFB filter 1032 includes a fully differential op-amp 1048 including differential inputs and differential outputs, wherein the differential inputs include a negative (−) input and a positive (+) input, and the differential outputs include a positive (+) output and a negative (−) output. The MFB filter 1032 is also shown as including feedback resistor components 1041 and 1045, having the same resistance value Rf, which are connected in the same manner as the resistor components 541 and 545 described above with reference to FIGS. 5 and 9. The MFB filter 1032 is also shown as including feedback capacitor components 1042 and 1049, having the same capacitance value Cf, which are connected in the same manner as the capacitor components 542 and 546 described above with reference to FIGS. 5 and 9. Similarly, the resistor components 1043 and 1047, having the same resistance value R0, are connected in the same manner as the resistor components 543 and 547 described above with reference to FIGS. 5 and 9. Further, the capacitor component 1058, having the capacitance value C0/2, is connected in the same manner as the capacitor component 548 described above with reference to FIGS. 5 and 9. The MFB filter 1032 is a fully differential filter because it includes both differential inputs and differential outputs.

Still referring to FIG. 10, the circuitry within the dashed lined block labeled 1033 can be referred to collectively as fully differential filter circuitry 1033 having differential inputs and differential outputs, wherein the differential inputs include a negative (−) input 1044 and a positive (+) input 1046, and the differential outputs include a positive (+) output 1050 and a negative (−) output 1052. The fully differential filter circuitry 1033 can be referred to more generically as fully differential signal processing circuitry. In FIG. 10, the cross-coupled segment 1054 is coupled between the differential input terminals 1034, 1036 of the MFB filter 1032 and the negative (−) input 1044 of the fully differential filter circuitry 1033, wherein the cross-coupled segment 1054 includes a resistor component 1053 having a resistance value R1a, and also includes a resistor component 1055 having a resistance value R1b. The cross-coupled segment 1056 is coupled between the differential input terminals 1034, 1036 of the MFB filter 1032 and the positive (+) input 1046 of the fully differential filter circuitry 1033, wherein the cross-coupled segment 1056 includes a resistor component 1059 having the resistance value R1a (which is the same resistance as the resistor component 1053), and also includes a resistor component 1057 having the resistance R1b value (which is the same resistance as the resistor component 1055). The resistor components 1053, 1055, 1057 and 1059 are adjustable resistor components, and thus, each can be said to have an adjustable resistance. Accordingly, the resistor components 1053 and 1059 can be said to have an adjustable resistance value R1a, and the resistor components 1055 and 1057 can be said to have an adjustable resistance value R1b.

More specifically, as can be appreciated from FIG. 10, the cross-coupled segment 1054 includes the resistor component 1053 having the adjustable resistance value R1a and the resistor component 1055 having the adjustable resistance value R1b. The resistor component 1053 is coupled between the negative (−) input terminal 1034 of the MFB filter 1032 and the negative (−) input 1044 of the fully differential filter circuitry 1033. The resistor component 1055 is coupled between the positive (+) input terminal 1036 of the MFB filter 1032 and the negative (−) input 1044 of the fully differential filter circuitry 1033. As can also be appreciated from FIG. 10, the cross-coupled segment 1056 includes the resistor component 1059 having the adjustable resistance value R1a and the resistor component 1057 having the adjustable resistance value R1b. The resistor component 1059 is coupled between the positive (+) input terminal 1036 of the MFB filter 1032 and the positive (+) input 1046 of the fully differential filter circuitry 1033. The resistor component 1057 is coupled between the negative (−) input terminal 1034 of the MFB filter 1032 and the positive (+) input 1046 of the fully differential filter circuitry 1033. The terms "resistance value" and "resistance" are used interchangeably herein, as are the terms "capacitance value" and "capacitance", the terms "inductance value" and "inductance", and the terms "impedance value" and "impedance".

Vo(s)/Vi(s) for the fully differential MFB LPF 1032 is shown in the following Equation(1 B):

$$\frac{Vo(s)}{Vi(s)} = \text{Gain} * \frac{\frac{-1}{C0 * Cf * R0 * Rf}}{s^2 + s * \frac{1}{C0} * \left(\frac{1}{R0} + \frac{1}{R1} + \frac{1}{Rf}\right) + \frac{1}{C0 * Cf * R0 * Rf}}$$

where,

Vi(s) is the voltage of the differential input signal,

Vo(s) is the voltage of the differential output signal,

Gain is equal to (Rf/R1b)−(Rf/R1a),

R0 is the resistance of each of the resistor components 1043 and 1047,

R1 is equal to (R1a*R1b)/(R1a+R1b),

R1a is the resistance of each of the resistor components 1053 and 1059,

R1b is the resistance of each of the resistor components 1055 and 1057,

Rf is the resistance of each of the feedback resistor components 1041 and 1045,

Cf is the capacitance of each of the feedback capacitor components 1042 and 1049, C0 is twice the capacitance of the capacitor component 1058, and s is a variable that represents complex frequency.

Beneficially, the gain of the fully differential MFB LPF 1032 can be adjusted, without substantially affecting a frequency response and without substantially affecting an input impedance of the fully differential MFB LPF 1032 (i.e., while keeping the frequency response substantially consistent and the input impedance substantially constant of the fully differential MFB LPF 1032), by only adjusting the resistance R1a (which is the resistance of each of the resistor component 1053 of the cross-coupled segment 1054 and the resistor component 1059 of the cross-coupled segment 1056), and adjusting the resistance R1b (which is the resistance of each of the resistor component 1055 of the cross-coupled segment 1054 and the resistor component 1057 of the cross-coupled segment 1056). Accordingly, the other seven passive components of the MFB filter (including the feedback resistor components 1041 and 1045, the feedback capacitor components 1042 and 1049, the resistor components 1043 and 1047, and the capacitive component 1058) need not be adjusted and can have fixed component values. This enables the MFB filter 1032 to be implemented in a relatively small die area, with relatively easy gain control. The condition that needs to be met, to keep the frequency response substantially consistent and the input impedance substantially constant of the fully differential MFB LPF 1032, is keeping substantially constant a specified relationship between component values of the cross-coupled segments 1054 and 1056. The gain of the fully differential MFB LPF 1032 is the same as the gain of the fully differential MFB LPF 502 (discussed above with reference to FIGS. 5 and 9), with R1 in equaling (R1a*R1b)/(R1a+R1b), which equation is referred to as Equation(1C) below. More specifically, the gain of the MFB filter 1032 can be adjusted, while keeping the frequency response of MFB filter 1032 substantially consistent and keeping the input impedance of the MFB filter 1032 substantially constant, by adjusting a value of the adjustable resistance R1a and a value of adjustable resistance R1b, which are resistance values of resistor components included in each of the cross-coupled segments 1054 and 1056, while keeping substantially constant the following Equation(1C):

$$\frac{R1a * R1b}{R1a + R1b}.$$

For a specific example, assume that four desired gain settings include gains of 14.00 dB, 10.00 dB, 6.00 dB and 2.00 dB. Also assume that the substantially constant impedance that each of the cross-coupled segments 1054, 1056 of the MFB filter 1032 is kept at is to be 400 ohms. The gain of 14.00 dB can be achieved by setting R1a equal to 490.58 ohms and setting R1b equal to 2166.32 ohms. The gain of 10.00 dB can be achieved by setting R1a equal to 572.27 ohms and setting R1b equal to 1328.28 ohms. The gain of 6.00 dB can be achieved by setting R1a equal to 639.44 ohms and setting R1b equal to 1068.22 ohms. The gain of 2.00 dB can be achieved by setting R1a equal to 690.59 ohms and setting R1b equal to 950.60 ohms. Negative gains can also be achieved if desired. For example, a gain of −2.00 dB can be achieved by setting R1a equal to 727.30 ohms and setting R1b equal to 888.85 ohms; and a gain of −4.00 dB can be achieved by setting R1a equal to 741.15 ohms and setting R1b equal to 860.00 ohms.

In the embodiment of FIG. 10, the positive (+) output of the op-amp 1048, the positive output 1050 of the fully differential filter circuitry 1033, and the positive output 1038 of the MFB filter 1032 are at the same node. Similarly, in the embodiment of FIG. 10, the negative (−) output of the op-amp 1048, the negative output 1052 of the fully differential filter circuitry 1033, and the negative output 1036 of the MFB filter 1032 are at the same node.

The fully differential MFB LPF 1032 is one example of a fully differential adjustable gain device that includes cross-coupled segments that can be used to adjust the gain of the device while keeping the input impedance of the device substantially constant and keeping the frequency response of the device substantially consistent. The term "device" as used herein can refer to a chip, a sub-circuit of a larger circuit included in a chip, a sub-circuit of a larger circuit included on a printed circuit board (PCB), or more generally, can be used to refer to a circuit. As will be described below, further embodiments of the present technology include other types of fully differential adjustable gain devices that include cross-coupled segments (similar to the cross-coupled segments 1054 and 1056) that can be used to adjust the gain of the device while keeping the input impedance of the device substantially constant and keeping the frequency response of the device substantially consistent.

While it would be preferred to adjust the gain of the fully differential MFB LPF 1032 (and other fully differential adjustable gain devices described herein) while keeping the input impedance of the device absolutely constant and keeping the frequency response of the device absolutely consistent, in an actual implementation this would be very difficult if not impossible to achieve. Rather, what is achievable and acceptable is adjusting the gain of the fully differential MFB LPF 1032 (and other fully differential adjustable gain devices described herein) while keeping the input impedance of the device substantially constant and keeping the frequency response of the device substantially consistent. The term "substantially constant" as used herein refers to within +/−10% of a specified value, and the term "substantially consistent" as used herein refers to within +/−10% of a response for a median gain setting. For example, if the specified input impedance for a device is 500 ohms, then keeping that input impedance substantially constant would be keeping the input impedance within 500 ohms+/−10%, or more specifically, keeping the input impedance within the range of 450 ohms to 550 ohms. Similarly, in an actual implementation, keeping a specified relationship between component values of cross-coupled segments (e.g., 1054 and 1056 in FIG. 6) absolutely constant may also not be achievable. Rather, what is achievable and acceptable is keeping the specified relationship between component values of cross-coupled segments (e.g., 1054 and 1056 in FIG. 6) substantially constant, wherein the term "substantially constant" refers to within +/−10% of a specified value. For example, keeping the relationship represented in Equation (1C) shown above substantially constant means keeping results of Equation(1C) within +/−10% of a specified value. For example, if the result of Equation(1C) for a median gain setting is the value 400, then for other gain settings that value should be kept within 400+/−10%, or more specifically, within the range of 360 and 440. In the discussion herein, the term "constant" may be used for brevity but can be interpreted as meaning "substantially constant." Similarly, the term "the same" may be used for brevity but can be interpreted as meaning "substantially the same."

Also shown in FIG. 10 is a fully differential VGA 1002 having cross-coupled segments 1024 and 1026, according to an embodiment of the present technology. The fully differential VGA 1002, which can also be referred to herein more succinctly as the VGA 1002, can be used as the VGA 416 in the receiver 804 initially described above with reference to FIG. 8. The VGA 1002 is shown as having differential input terminals, including a negative (−) input terminal 1004 and a positive (+) input terminal 1006. The VGA 1002 is also shown as having differential output terminals, including a positive (+) output terminal 1008 and a negative (−) output terminal 1006. The VGA 1002 includes a fully differential op-amp 1018 including differential inputs and differential outputs, wherein the differential inputs include a negative (−) input and a positive (+) input, and the differential outputs include a positive (+) output and a negative (−) output. The VGA 1002 is a fully differential amplifier because it includes differential inputs and differential outputs.

In the VGA 1002, the positive (+) output of the op-amp 1018 is connected to the negative (−) input of the op-amp 1018 by a feedback capacitor component 1062 having a capacitance value Cf. The negative (−) output of the op-amp 1018 is connected to the positive (+) input of the op-amp 1018 by a feedback capacitor component 1066 having the same capacitance value Cf as the feedback capacitor component 1062. The VGA 1002 also includes feedback resistor components 1061 and 1065 that each have the same resistance value Rf. The feedback resistor component 1061 is connected in parallel with the feedback capacitor component 1062, and thus, the positive (+) output of the op-amp 1018 is also connected to the negative (−) input of the op-amp 1018 by the feedback resistor component 1061 having a resistance value Rf. The feedback resistor component 1065 is connected in parallel with the feedback capacitor component 1066, and thus, the negative (−) output of the op-amp 1018 is also connected to the positive (+) input of the op-amp 1018 by the feedback resistor component 1065 having the same resistance value Rf as the feedback resistor component 1061.

Still referring to FIG. 10, the circuitry within the dashed lined block labeled 1012 can be referred to collectively as fully differential gain circuitry 1012 having differential inputs and differential outputs, wherein the differential inputs include a negative (−) input 1014 and a positive (+) input 1016, and the differential outputs include a positive (+) output 1020 and a negative (−) output 1022. The fully differential filter circuitry 1012 can be referred to more generically as fully differential signal processing circuitry. In FIG. 10, the cross-coupled segment 1024 is coupled between the differential input terminals 1004, 1006 of the VGA 1002 and the negative (−) input 1014 of the fully differential filter circuitry 1012, wherein the cross-coupled segment 1024 includes a resistor component 1023 having a resistance value R1a, and also includes a resistor component 1025 having a resistance value R1b. Additionally, the cross-coupled segment 1026 is coupled between the differential input terminals 1004, 1006 of the VGA 1002 and the positive (+) input 1016 of the fully differential filter circuitry 1012, wherein the cross-coupled segment 1026 includes a resistor component 1029 having the resistance value R1a' (which is the same resistance as the resistor component 1023), and also includes a resistor component 1027 having the resistance R1b' value (which is the same resistance as the resistor component 1025). The resistor components 1023, 1025, 1027 and 1029 are adjustable resistor components, and thus, each can be said to have an adjustable resistance. Accordingly, the resistor components 1023 and 1029 can be said to have an adjustable resistance value R1a', and the resistor components 1025 and 1027 can be said to have an adjustable resistance value R1b'.

More specifically, as can be appreciated from FIG. 10, the cross-coupled segment 1024 includes the resistor component 1023 having the adjustable resistance value R1a' and the resistor component 1025 having the adjustable resistance value R1b'. The resistor component 1023 is coupled between the negative (−) input terminal 1004 of the VGA 1002 and the negative (−) input 1014 of the fully differential filter circuitry 1012. The resistor component 1025 is coupled between the positive (+) input terminal 1006 of the VGA 1002 and the negative (−) input 1014 of the fully differential filter circuitry 1012. As can also be appreciated from FIG. 10, the cross-coupled segment 1026 includes the resistor component 1029 having the adjustable resistance value R1a' and the resistor component 1027 having the adjustable resistance value R1b'. The resistor component 1029 is coupled between the positive (+) input terminal 1006 of the VGA 1002 and the positive (+) input 1016 of the fully differential filter circuitry 1012. The resistor component 1027 is coupled between the negative (−) input terminal 1004 of the VGA 1002 and the positive (+) input 1016 of the fully differential filter circuitry 1012.

Vo(s)/Vi(s) for the fully differential VGA 1002 is shown in the following Equation(2B):

$$\frac{Vo(s)}{Vi(s)} = -\text{Gain} * \frac{1}{1 + (s * Rf' * Cf')}$$

where,
Vi(s) is the voltage of the differential input signal,
Vo(s) is the voltage of the differential output signal,
Gain is equal to Rf'*(R1a'−R1b')/(R1a'*R1b'),
Cf is the capacitance of each of the feedback capacitor components 1062 and 1066,
Rf is the resistance of each of the feedback resistor components 1061 and 1065, and
s is a variable that represents complex frequency.

Beneficially, the gain of the VGA 1002 can be adjusted, without substantially affecting a frequency response and without substantially affecting an input impedance of the fully differential VGA 1002 (i.e., while keeping the frequency response of the fully differential VGA 1002 substantially consistent, and keeping the input impedance of the fully differential VGA 1002 substantially constant), by only adjusting resistance R1a' (which is the resistance of each of the resistor component 1023 of the cross-coupled segment 1024 and the resistor component 1029 of the cross-coupled segment 1026), and adjusting the resistance R1b' (which is the resistance of each of the resistor component 1025 of the cross-coupled segment 1024 and the resistor component 1027 of the cross-coupled segment 1026). Accordingly, the other passive components of the VGA 1002 need not be adjusted and can have fixed component values. This enables the VGA 1002 to be implemented in a relatively small die area, with relatively easy gain control. The condition that needs to be met, to keep the frequency response substantially consistent and the input impedance substantially constant of the fully differential VGA 1002, is keeping substantially constant a specified relationship between component values of the cross-coupled segments 1024 and 1026. More specifically, the gain of the VGA 1002 can be adjusted, while keeping the frequency response of the VGA 1002 substantially consistent and the input impedance of the VGA substantially constant, by adjusting a value of the adjustable resistance R1a' and a value of adjustable resistance R1b', which are resistance values of resistor components included in each of the cross-coupled segments 1024 and 1026, while keeping substantially constant the following Equation(2C):

$$\frac{R1a' * R1b'}{R1a' + R1b'}.$$

In the embodiment of FIG. 10, the positive (+) output of the op-amp 1018, the positive output 1020 of the fully differential filter circuitry 1012, and the positive output 1008 of the VGA 1002 are at the same node. Similarly, in the embodiment of FIG. 10, the negative (−) output of the op-amp 1018, the negative output 1022 of the fully differential filter circuitry 1012, and the negative output 1010 of the VGA 1002 are at the same node.

In FIG. 10, when discussing the MFB filter 1032, the cross-coupled segment 1054 was described as including adjustable resistor components 1053 and 1055, and the cross-coupled segment 1056 was described as including adjustable resistor components 1059 and 1057, wherein the adjustable resistor components 1053 and 1059 have an adjustable resistance value R1a', and the adjustable resistor components 1055 and 1057 have an adjustable resistance value R1b'. More generally, the cross-coupled segment 1054 includes adjustable impedance components 1053 and 1055, and the cross-coupled segment 1056 includes adjustable impedance components 1059 and 1057, wherein the adjustable impedance components 1053 and 1059 have an adjustable impedance value Z1a', and the adjustable impedance components 1055 and 1057 have an adjustable impedance value Z1b'.

In FIG. 10, when discussing the VGA 1002, the cross-coupled segment 1024 was described as including adjustable resistor components 1023 and 1025, and the cross-coupled segment 1026 was described as including adjustable resistor components 1029 and 1027, wherein the adjustable resistor components 1023 and 1029 have an adjustable resistance value R1a', and the adjustable resistor components 1025 and 1027 have an adjustable resistance value R1b'. More generally, the cross-coupled segment 1024 includes adjustable impedance components 1023 and 1025, and the cross-coupled segment 1026 includes adjustable impedance components 1029 and 1027, wherein the adjustable impedance components 1023 and 1029 have an adjustable impedance value Z1 a', and the adjustable impedance components 1025 and 1027 have an adjustable impedance value Z1b'. Depending upon implementation, the aforementioned adjustable impedance components can be implemented using adjustable resistor components, but are not limited thereto. For example, adjustable impedance components can be either adjustable resistor components, adjustable capacitor components, or adjustable inductor components. It would also be possible that such adjustable impedance components are combinations of adjustable resistor, capacitor and/or inductor components. In other words, impedance components having an adjustable impedance can alternatively be, e.g., RC components, RL components, RCL components, or CL components, but are not limited thereto.

Figure 11:
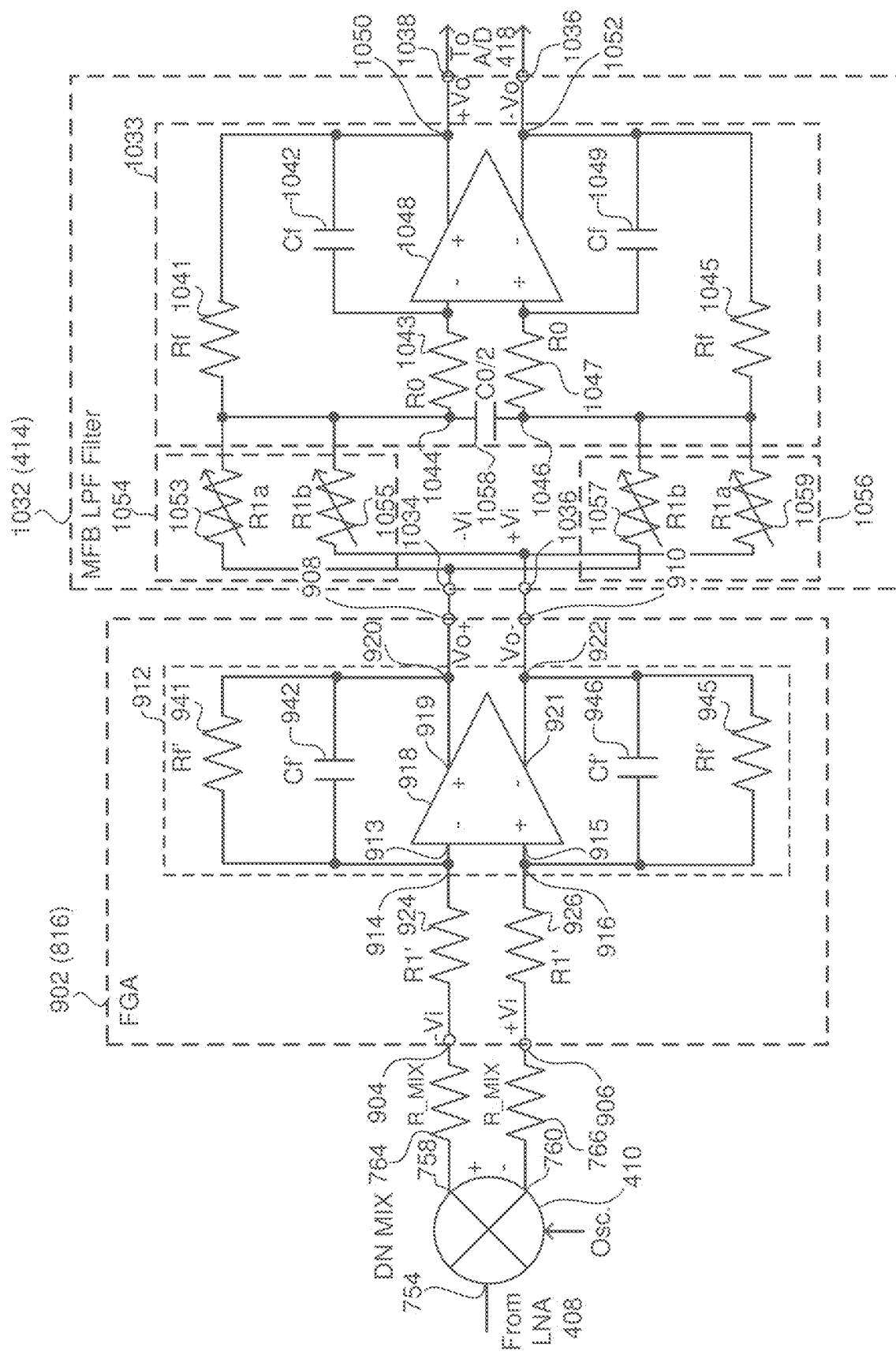

FIG. 11 illustrates an embodiment where the amplifier 902 (that is downstream of the mixer 410) is configured to have a fixed gain, and thus can be referred to as an FGA 902, and where the MFB LPF filter 502 has a variable gain and includes cross-coupled segments 1054 and 1056, as was described above with reference to FIG. 10. Details of the amplifier 902 shown in FIG. 11 can be appreciated from the above discussion of FIG. 9, and thus need not be repeated. Details of the MFB LPF 1032 shown in FIG. 11 can be appreciated from the above discussion of FIG. 10, and thus need not be repeated. Referring briefly back to FIG. 8, in still another embodiment, the FGA or VGA 816 (that is downstream of the mixer 410) is configured to have a variable gain and is implemented using the VGA 1002 shown in FIG. 10 (having the cross-coupled segments 1024 and 1026), and the MFB LPF filter 414 is configured to have a fixed gain and is implemented using the MFB LPF 502 (shown in FIGS. 5 and 9). In still other embodiments, the MFB filters described herein can instead be implemented as either a band pass filter (BPF) or a high pass filter (HPF), depending upon implementation. In such alternative embodiments, the FGA or VGA 816 would still be positioned within the receive signal path between the mixer 410 and the MFB filter, such that the FGA or VGA is downstream of the mixer 410, and the MFB filter is downstream of the FGA or VGA.

In the discussion FIGS. 8-11 the mixer 410 was described as being used to frequency down-convert a signal. Depending upon implementation, the mixer 410 can alternatively be used to frequency up-convert an RF signal, in accordance with alternative embodiments.

In the discussion of FIGS. 8-11 the block 414 was described as being a fully differential multi-feedback (MFB) low pass filter (LPF). The block 414 can alternatively be replaced with another type of fully differential filter, such as a fully differential bandpass filter (BPF), or a fully differential high pass filter (HPF). Depending upon implementation, such alternative types of fully differential filters may or may not be MFB type filters.

Figure 12:
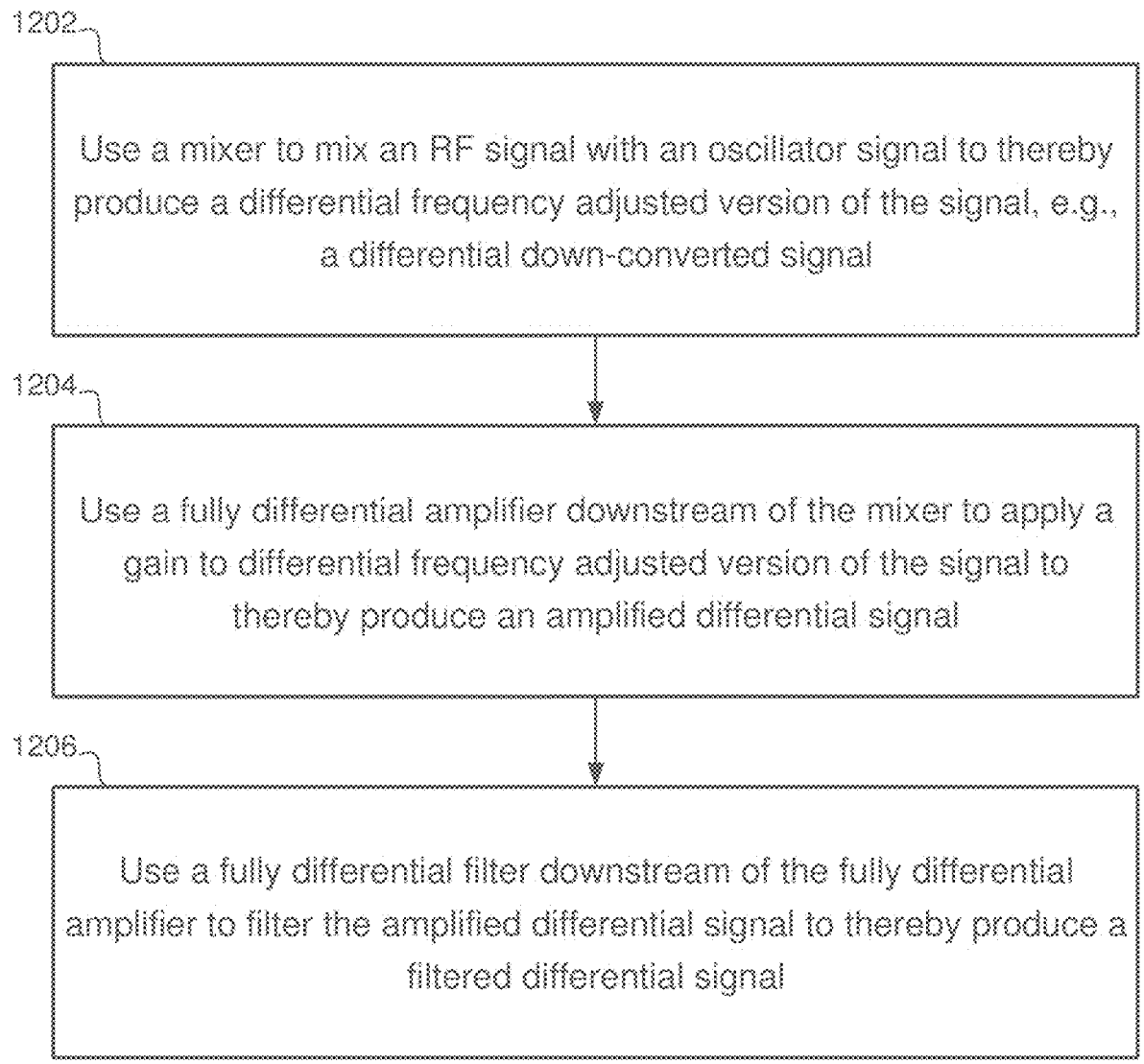
FIG. 12 is a high level flow diagram that is used to summarize methods according to various embodiments of the present technology.

FIG. 12 is a high-level flow diagram that is used to summarize methods according to various embodiments of the present technology. Such methods are for use by a receiver, such as the receiver 804 described above with reference to FIG. 8, and additional details of which were described above with reference to FIGS. 9 and 10.

Referring to FIG. 12, step 1202 involves using a mixer to mix an RF signal with an oscillator signal to thereby produce a differential frequency adjusted version of the RF signal, e.g., a differential down-converted signal. Step 1204 involves using a fully differential amplifier downstream of the mixer to apply a gain to the differential frequency adjusted version of the signal to thereby produce an amplified differential signal. Step 1206 involves using a fully differential filter downstream of the fully differential amplifier to filter the amplified differential signal to thereby produce a filtered differential signal. Referring briefly back to FIG. 8-11, step 1202 can be performed by the mixer 410, step 1204 can be performed by the FGA or VGA 816 (and more specifically, the FGA 902 or VGA 1002), and step 1206 can be performed by the MFB filter 814 (and more specifically, the MFB filter 502 or 1032).

As can be appreciated from FIGS. 8-11, such a mixer, fully differential VGA, and fully differential filter are each part of a receive signal path of a receiver. As was described above in additional detail, by using the fully differential filter downstream of the fully differential FGA or VGA within the receive signal path, distortion in the receive signal path is mitigated compared to if the fully differential filter were used upstream of the fully differential FGA or VGA.

As can be appreciated from the above discussion of FIGS. 8-11, in the embodiments shown therein, no current buffering is performed by any trans-impedance amplifier (TIA) downstream of the mixer 410, and thus, the receive signal path is beneficially devoid of noise degradation, linearity degradation, and power dissipation that would have otherwise be caused by a TIA, if a TIA was used to perform current buffering downstream of the mixer within the receive signal path.

As can be appreciated from the above discussion of FIGS. 8-11, the fully differential FGA or VGA is configured to provide a first-order frequency response and a first (optionally adjustable) gain, and the fully differential filter (which is downstream of the fully differential FGA or VGA) is configured to provide a second-order frequency response and a second (optionally adjustable) gain. Accordingly, collectively the fully differential VGA and the fully differential filter provide a third-order low pass filter frequency response. In accordance with certain embodiments, the method summarized with reference to FIG. 12 can also include independently adjusting a first adjustable gain provided by the fully differential VGA, and a second adjustable gain provided by the fully differential filter, to thereby optimize linearity of the third-order low pass filter frequency response and optimize noise mitigation within the receive signal path.

In accordance with certain embodiments of the technology, which can be appreciated from the above discussion of FIG. 10, the method summarized with reference to FIG. 12 can include maintaining substantially consistent the first-order frequency response of the fully differential VGA, and maintaining substantially constant an input impedance of the fully differential VGA, over a range of different gain settings for the first adjustable gain of the fully differential VGA. Additionally, the method can include maintaining substantially consistent the second-order frequency response of the fully differential filter, and maintaining substantially constant an input impedance of the fully differential filter, over a range of different gain settings for the second adjustable gain of the fully differential filter.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A receiver, comprising:
a mixer coupled to receive an RF signal and a local oscillation signal, and configured to produce a differential down converted signal at one of a baseband or intermediate frequency (IF);
a differential variable gain amplifier (VGA) coupled downstream of the mixer and coupled to receive the differential down converted signal produced by the mixer, and configured to produce an amplified differential signal; and
a differential filter coupled downstream of the differential VGA and coupled to receive the amplified differential signal from the differential VGA, and configured to filter the amplified differential signal, and produce a filtered differential signal;
the differential VGA including differential input terminals, differential output terminals, and signal processing circuitry between the differential input terminals and the differential output terminals of the VGA; and
the differential VGA also including first and second cross-coupled segments, the first cross-coupled segment coupled between the differential input terminals of the VGA and a negative (−) input of the signal processing circuitry, and the second cross-coupled segment coupled between the differential input terminals of the VGA and a positive (+) input of the signal processing circuitry;

wherein the mixer, the differential VGA, and the differential filter are each part of a receive signal path of the receiver and are coupled in that sequential order.

2. The receiver of claim 1, wherein by locating the differential filter downstream of the differential VGA within the receive signal path, distortion in the receive signal path is mitigated compared to if the differential filter were located upstream of the differential VGA.

3. The receiver of claim 1, wherein the receive signal path is devoid of a trans-impedance amplifier (TIA) downstream of the mixer, and thus, the receive signal path is devoid of noise degradation, linearity degradation, and power dissipation that would otherwise be caused by a TIA if the receive signal path included a TIA downstream of the mixer.

4. The receiver of claim 1, wherein:
the differential VGA is configured to provide a first-order frequency response;
the differential filter, which is downstream of the differential VGA, is configured to provide a second-order frequency response; and
the differential VGA and the differential filter collectively provide a third-order low pass filter frequency response.

5. The receiver of claim 4, wherein:
the differential VGA is configured to provide a first adjustable gain;
the differential filter is configured to provide a second adjustable gain; and
the first adjustable gain provided by the differential VGA, and the second adjustable gain provided by the differential filter, are independently adjustable and thereby enable linearity of the third-order low pass filter frequency response to be optimized and noise mitigation within the receive signal path to be optimized through separate adjustments to the first adjustable gain and the second adjustable gain.

6. The receiver of claim 4, wherein:
the differential VGA is configured to provide a first adjustable gain; and
the differential VGA is configured such that the first-order frequency response thereof is maintained substantially consistent, and an input impedance thereof is maintained substantially constant, over a range of different gain settings for the first adjustable gain of the differential VGA.

7. The receiver of claim 6, wherein:
the first adjustable gain of the differential VGA is adjustable by adjusting one or more component values of the first and second cross-coupled segments, while maintaining substantially consistent the first-order frequency response of the differential VGA and maintaining substantially constant the input impedance of the differential VGA, so long as a specified relationship between the component values of the first and second cross-coupled segments is kept substantially constant.

8. The receiver of claim 4, wherein the differential filter, which is downstream of the differential VGA, has an adjustable gain and is configured such that the second-order frequency response thereof is maintained substantially consistent, and an input impedance thereof is maintained substantially constant, over a range of different settings for the adjustable gain of the differential filter.

9. The receiver of claim 8, wherein the differential filter has an adjustable gain and comprises:
differential input terminals, differential output terminals, and filter circuitry between the differential input terminals and the differential output terminals of the differential filter;
third and fourth cross-coupled segments, the third cross-coupled segment coupled between the differential input terminals of the differential filter and a negative (−) input of the filter circuitry, and the fourth cross-coupled segment coupled between the differential input terminals of the differential filter and a positive (+) input of the filter circuitry;
wherein the adjustable gain of the differential filter is adjustable by adjusting one or more component values of the third and fourth cross-coupled segments, while maintaining substantially consistent the second-order frequency response of the differential filter and maintaining substantially constant the input impedance of the differential filter, so long as a specified relationship between the component values of the third and fourth cross-coupled segments is kept substantially constant.

10. The receiver of claim 1, wherein the differential filter, which is downstream of the differential VGA, comprises a differential multi-feedback (MFB) low pass filter (LPF) that includes a single fully differential operational amplifier, a pair of feedback resistors, and a pair of feedback capacitors.

11. A method for use within a receiver, the method comprising:
using a mixer to mix an RF signal with an oscillator signal to thereby produce a differential down converted signal at one of a baseband or intermediate frequency (IF);
using a differential variable gain amplifier (VGA) downstream of the mixer to apply a gain to the differential down converted signal to thereby produce an amplified differential signal, wherein the differential VGA includes a first cross-coupled segment between differential input terminals of the differential VGA and a negative (−) input of signal processing circuitry of the differential VGA, and also includes a second cross-coupled segment between the differential input terminals of the differential VGA and a positive (+) input of the signal processing circuitry of the differential VGA;
using a differential filter downstream of the differential VGA to filter the amplified differential signal to thereby produce a filtered differential signal; and
adjusting a gain of the differential VGA, while maintaining a substantially consistent frequency response and a substantially constant input impedance of the differential VGA, by adjusting one or more component values of the first and second cross-coupled segments while keeping substantially constant a specified relationship between the component values of the first and second cross-coupled segments;
wherein the mixer, the fully differential VGA, and the fully differential filter are each part of a receive signal path of the receiver and are coupled in that sequential order.

12. The method of claim 11, wherein by using the differential filter downstream of the differential VGA within the receive signal path, distortion in the receive signal path is mitigated compared to if the differential filter were used upstream of the differential VGA.

13. The method of claim 11, wherein no current buffering is performed by any trans-impedance amplifier (TIA) downstream of the mixer, and thus, the receive signal path is devoid of noise degradation, linearity degradation, and power dissipation that would have otherwise been caused by a TIA, if a TIA was used to perform current buffering downstream of the mixer within the receive signal path.

14. The method of claim 11, wherein:
the differential VGA is configured to provide a first-order frequency response;
the differential filter, which is downstream of the differential VGA, is configured to provide a second-order frequency response; and
the differential VGA and the differential filter collectively provide a third-order low pass filter frequency response.

15. The method of claim 14, wherein the differential VGA has a first adjustable gain, and the differential filter has a second adjustable gain, the method further comprising:
independently adjusting the first adjustable gain provided by the differential VGA, and the second adjustable gain provided by the differential filter, to optimize linearity of the third-order low pass filter frequency response and optimize noise mitigation within receive signal path.

16. The method of claim 14, further comprising:
maintaining substantially consistent the first-order frequency response of the differential VGA, and maintaining substantially constant an input impedance of the differential VGA, over a range of different gain settings for the adjustable gain of the differential VGA.

17. The method of claim 14, the differential filter has an adjustable gain, the method further comprising:
maintaining substantially consistent the second-order frequency response of the differential filter, and maintaining substantially constant an input impedance of the differential filter, over a range of different gain settings for the adjustable gain of the differential filter.

18. A receiver, comprising:
a low noise amplifier (LNA) configured to receive an RF signal from an antenna or coupler;
a mixer configured to receive the RF signal from the LNA, receive an oscillator signal, and output a differential down converted signal at one of a baseband or intermediate frequency (IF);
a differential fixed gain amplifier (FGA) or variable gain amplifier (VGA) downstream of the mixer and configured to receive the differential down converted signal from the mixer, apply a gain thereto, and output an amplified differential signal;
a differential filter downstream of the differential FGA or VGA and configured to receive the amplified differential signal from the differential FGA or VGA, filter the amplified differential signal, and output a filtered differential signal;
the differential filter having an adjustable gain and comprising differential input terminals, differential output terminals, and filter circuitry between the differential input terminals and the differential output terminals of the differential filter;
the differential filter also having first and second cross-coupled segments, the first cross-coupled segment coupled between the differential input terminals of the differential filter and a negative (−) input of the filter circuitry, and the second cross-coupled segment coupled between the differential input terminals of the differential filter and a positive (+) input of the filter circuitry; and
an analog-to-digital converter (A/D) downstream of the differential filter and configured to convert the filtered differential signal to a digital signal;
wherein the LNA, the mixer, the fully differential FGA or VGA, and the fully differential filter are each part of a receive signal path of the receiver and are coupled in that sequential order.

19. The receiver of claim 18, wherein by locating the differential filter downstream of the differential FGA or VGA within the receive signal path, distortion in the receive signal path that is caused by the mixer is mitigated compared to if the differential filter were located upstream of the differential FGA or VGA.

20. The receiver of claim 18, wherein:
the differential FGA or VGA is a differential VGA configured to provide a first-order frequency response and a first adjustable gain;
the differential filter, which is downstream of the differential FGA or VGA, is configured to provide a second-order frequency response and a second adjustable gain;
the differential VGA and the differential filter collectively provide a third-order low pass filter frequency response; and
the first adjustable gain provided by the differential VGA, and the second adjustable gain provided by the differential filter, are independently adjustable and thereby enable linearity of the third-order low pass filter frequency response to be optimized and noise mitigation within receive signal path to be optimized through separate adjustments to the first adjustable gain and the second adjustable gain.

21. The receiver of claim 20, wherein the adjustable gain of the differential filter is adjustable by adjusting one or more component values of the first and second cross-coupled segments, while maintaining substantially consistent the second-order frequency response of the differential filter and maintaining substantially constant the input impedance of the differential filter, so long as a specified relationship between the component values of the first and second cross-coupled segments is kept substantially constant.

* * * * *